United States Patent [19]
Beers et al.

[11] Patent Number: 6,132,667
[45] Date of Patent: Oct. 17, 2000

[54] STEREOLITHOGRAPHIC METHOD AND APPARATUS WITH ENHANCED CONTROL OF PRESCRIBED STIMULATION PRODUCTION AND APPLICATION

[75] Inventors: Ross D. Beers, La Crescenta; Michelle D. Guertin, Valencia, both of Calif.

[73] Assignee: 3D Systems, Inc., Valencia, Calif.

[21] Appl. No.: 09/247,114

[22] Filed: Feb. 8, 1999

[51] Int. Cl.$^7$ ............................ B29C 35/08; B29C 41/02
[52] U.S. Cl. ...................... 264/401; 425/174.4; 425/375; 700/120
[58] Field of Search .................................. 264/308, 401; 425/174.4, 375; 700/120

[56] References Cited

U.S. PATENT DOCUMENTS

| | | |
|---|---|---|
| 4,575,330 | 3/1986 | Hull . |
| 4,752,352 | 6/1988 | Feygin . |
| 4,863,538 | 9/1989 | Deckard . |
| 4,999,143 | 3/1991 | Hull et al. . |
| 5,015,312 | 5/1991 | Kinzie . |
| 5,058,988 | 10/1991 | Spence . |
| 5,059,021 | 10/1991 | Spence et al. . |
| 5,076,974 | 12/1991 | Modrek et al. . |
| 5,104,592 | 4/1992 | Hull et al. . |
| 5,121,329 | 6/1992 | Crump . |
| 5,123,734 | 6/1992 | Spence et al. . |
| 5,133,987 | 7/1992 | Spence et al. . |
| 5,141,680 | 8/1992 | Almquist et al. . |
| 5,143,663 | 9/1992 | Leyden et al. . |
| 5,174,931 | 12/1992 | Almquist et al. . |
| 5,182,056 | 1/1993 | Spence et al. . |

(List continued on next page.)

FOREIGN PATENT DOCUMENTS

| | | |
|---|---|---|
| WO 95/18009 | 7/1995 | WIPO . |
| WO 96/12607 | 5/1996 | WIPO . |
| WO 96/12608 | 5/1996 | WIPO . |
| WO 96/12609 | 5/1996 | WIPO . |
| WO 96/12610 | 5/1996 | WIPO . |

OTHER PUBLICATIONS

Jacobs, "Rapid Prototyping & Manufacturing: Fundamentals of StereoLithography," Society of Manufacturing Engineers, 1992.

Jacobs, "Stereolithography and other RP&M Technologies," Society of Manufacturing Engineers, 1996.

U.S. Pat. Application No. 08/722,335, filed Sep. 27, 1996 by Leyden et al. (now abandoned).

U.S. Pat. application No. 08/855,125, filed May 13, 1997 by Nguyen, et al.

(List continued on next page.)

*Primary Examiner*—Leo B. Tentoni
*Attorney, Agent, or Firm*—Dennis R. Smalley; Ralph D'Alessandro

[57] ABSTRACT

A rapid prototyping and manufacturing (e.g. stereolithography) method and apparatus for producing three-dimensional objects by selectively subjecting a liquid or other fluid-like material to a beam of prescribed stimulation. In a preferred embodiment a source of prescribed stimulation is controlled to reduce or inhibit the production of the prescribed stimulation during at least some periods when the prescribed stimulation is not needed to expose the material. In another preferred embodiment, the source of stimulation is controlled to vary the quantity of prescribed stimulation that is produced and allowed to reach the material. In an additional preferred embodiment control of laser output occurs based on a combination of supplying a regulated amount of voltage to an AOM in conjunction with temporary sensing of laser power and a known desired power to attain. In a further preferred embodiment, a quantity of prescribed stimulation may be set by consideration of desired solidification depths to be used, beam profile characteristics, material properties, and scanning speed limitations for different data types. In a still further preferred embodiment, a transition between selected consecutive exposure vectors is performed by scanning one or more interposed non-exposure vectors with the beam inhibited from reaching the building material.

8 Claims, 12 Drawing Sheets

6,132,667

Page 2

U.S. PATENT DOCUMENTS

| | | |
|---|---|---|
| 5,182,715 | 1/1993 | Vorgitch et al. . |
| 5,184,307 | 2/1993 | Hull et al. . |
| 5,192,469 | 3/1993 | Hull et al. . |
| 5,192,559 | 3/1993 | Hull et al. . |
| 5,209,878 | 5/1993 | Smalley et al. . |
| 5,234,636 | 8/1993 | Hull et al. . |
| 5,238,639 | 8/1993 | Vinson et al. . |
| 5,256,340 | 10/1993 | Allison et al. . |
| 5,321,622 | 6/1994 | Snead et al. . |
| 5,597,520 | 1/1997 | Smalley et al. . |
| 5,840,239 | 11/1998 | Partanen et al. . |
| 5,902,537 | 5/1999 | Almquist et al. . |
| 5,902,538 | 5/1999 | Kruger et al. ............... 264/401 |
| 5,943,235 | 8/1999 | Earl et al. . |
| 5,945,058 | 8/1999 | Manners et al. . |
| 6,001,297 | 12/1999 | Partanen et al. ............... 264/401 |

OTHER PUBLICATIONS

U.S. Pat. application No. 09/061,796, filed Apr. 16, 1998 by Wu, et al.

U.S Pat. application No. 09/154,967, filed Sep. 17, 1998 by Nguyen, et al.

U.S. Pat. application No. 09/246,416, filed Feb. 8, 1999 by Bishop, et al.

U.S. Pat. application No. 09/246,504, filed Feb. 8, 1999 by Guertin, et al.

U.S. Pat. application No. 09/247,113, filed Feb. 8, 1999 by Chari, et al.

U.S. Pat. application No. 09/247,119, filed Feb. 8, 1999 by Kulkarni, et al.

U.S. Pat. application No. 09/247,120, filed Feb. 8, 1999 by Everett, et al.

U.S. Patt. application No. 09/248,352, filed Feb. 8, 1999 by Manners, et al.

U.S. Pat. application No. 09/484,984, filed Jan. 18, 2000 by Earl, et al.

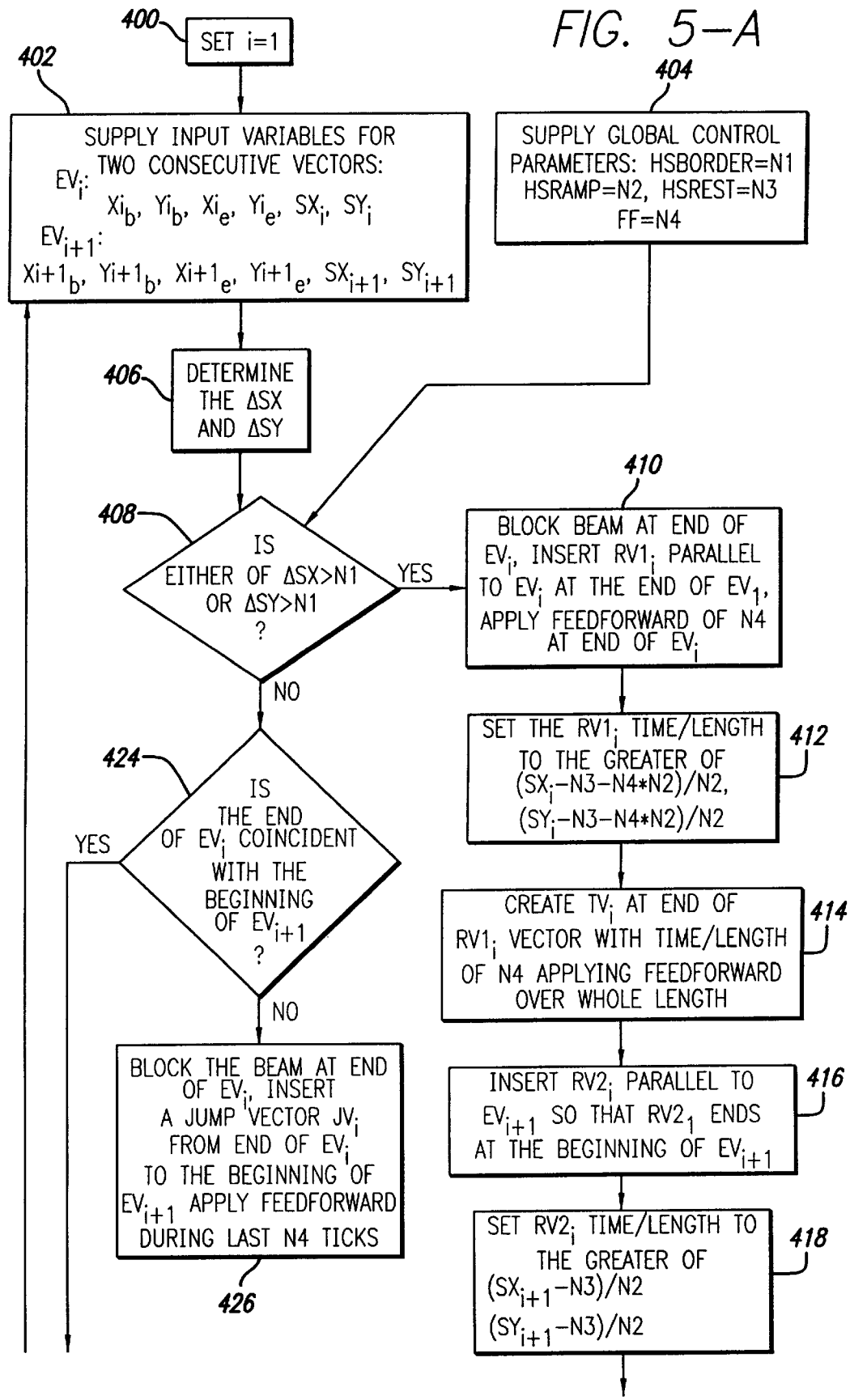
FIG. 5-A

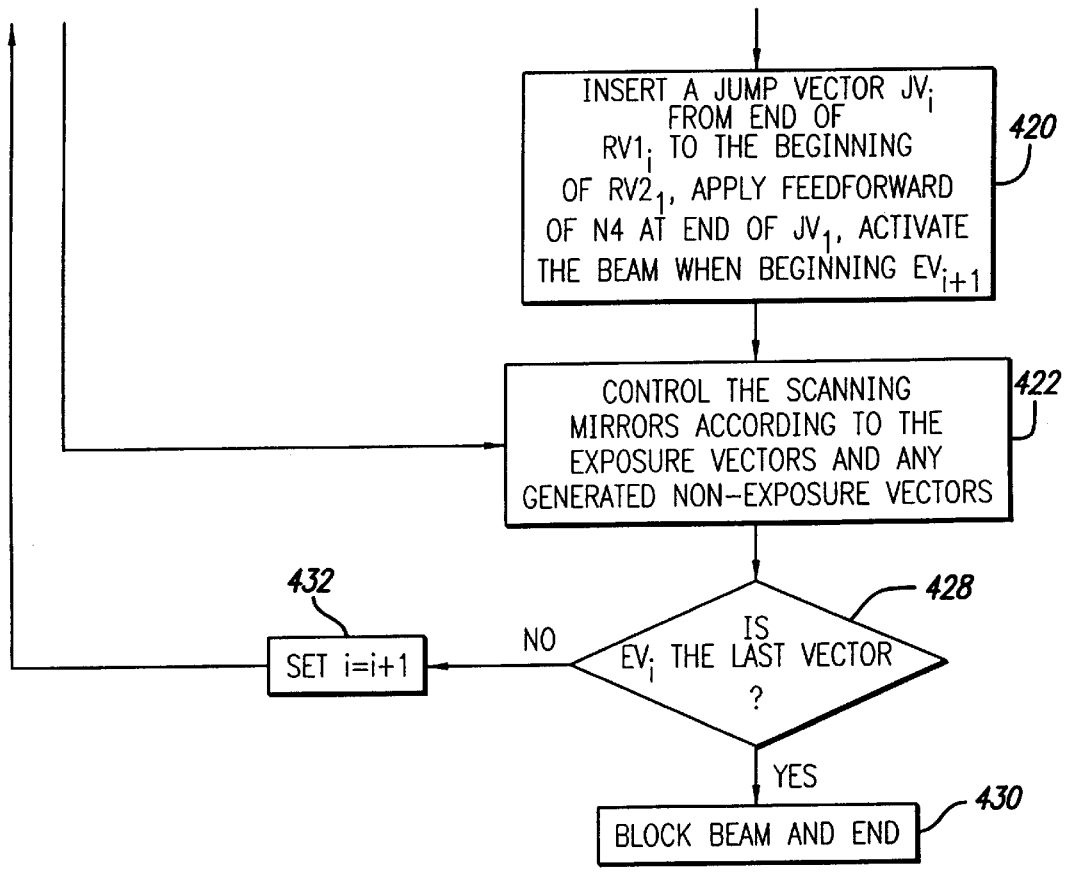
FIG. 5-B

STEREOLITHOGRAPHIC METHOD AND APPARATUS WITH ENHANCED CONTROL OF PRESCRIBED STIMULATION PRODUCTION AND APPLICATION

FIELD OF THE INVENTION

This invention relates to the formation of three-dimensional objects using a Rapid Prototyping and Manufacturing (RP&M) technique (e.g. stereolithography). The invention more particularly relates to the formation of three-dimensional objects using enhanced production control of prescribed stimulation and its application to a building material.

BACKGROUND OF THE INVENTION

1. Related Art

Rapid Prototyping and Manufacturing (RP&M) is the name given to a field of technologies that can be used to form three-dimensional objects rapidly and automatically from three-dimensional computer data representing the objects. RP&M can be considered to include three classes of technologies: (1) Stereolithography, (2) Selective Deposition Modeling, and (3) Laminated Object Manufacturing.

The stereolithography class of technologies create three-dimensional objects based on the successive formation of layers of a fluid-like material adjacent to previously formed layers of material and the selective solidification of those layers according to cross-sectional data representing successive slices of the three-dimensional object in order to form and adhere laminae (i.e. solidified layers). One specific stereolithography technology is known simply as stereolithography and uses a liquid material that is selectively solidified by exposing it to prescribed stimulation. The liquid material is typically a photopolymer and the prescribed stimulation is typically visible or ultraviolet electromagnetic radiation. The radiation is typically produced by a laser though other sources of radiation are possible such as arc lamps, resistive lamps, and the like. Exposure may occur by scanning a beam or by controlling a flood exposure by use of a light valve that selectively transmits or reflects the radiation. Liquid-based stereolithography is disclosed in various patents, applications, and publications of which a number are briefly described in the Related Applications section hereafter.

Another stereolithography technology is known as Selective Laser Sintering (SLS). SLS is based on the selective solidification of layers of a powdered material by exposing the layers to infrared electromagnetic radiation to sinter or fuse the powder particles. SLS is described in U.S. Pat. No. 4,863,538, issued Sep. 5, 1989, to Deckard. A third technology is known as Three Dimensional Printing (3DP). 3DP is based on the selective solidification of layers of a powdered material which are solidified by the selective deposition of a binder thereon. 3DP is described in U.S. Pat. No. 5,204,055, issued Apr. 20, 1993, to Sachs.

The present invention is primarily directed to stereolithography using liquid-based building materials (i.e. medium). It is believed, however, that the techniques of the present invention may have application in the other stereolithography technologies.

Selective Deposition Modeling, SDM, involves the build-up of three-dimensional objects by selectively depositing solidifiable material on a lamina-by-lamina basis according to cross-sectional data representing slices of the three-dimensional object. The material being dispensed may be solidified upon cooling, by heating, exposing to radiation, or upon application of a second physical material. A single material may be dispensed or multiple materials dispensed with each having different properties. One such technique is called Fused Deposition Modeling, FDM, and involves the extrusion of streams of heated, flowable material which solidify as they are dispensed onto the previously formed laminae of the object. FDM is described in U.S. Pat. No. 5,121,329, issued Jun. 9, 1992, to Crump. Another technique is called Ballistic Particle Manufacturing, BPM, which uses a 5-axis, ink-jet dispenser to direct particles of a material onto previously solidified layers of the object. BPM is described in PCT publication numbers WO 96-12607, published May 2, 1996, by Brown; WO 96-12608, published May 2, 1996, by Brown; WO 96-12609, published May 2, 1996, by Menhennett; and WO 96-12610, published May 2, 1996, by Menhennett. A third technique is called Multijet Modeling, MJM, and involves the selective deposition of droplets of material from multiple ink jet orifices to speed the building process. MJM is described in U.S. Pat. No. 5,943,235, filed Sep. 27, 1996 and issued Aug. 24, 1999 to Earl et al. and in U.S. patent application Ser. No. 08/722,335, filed Sep. 27, 1996, by Leyden et al. now abandoned (both assigned to 3D Systems, Inc. as is the instant application).

Laminated Object Manufacturing, LOM, techniques involve the formation of three-dimensional objects by the stacking, adhering, and selective cutting of sheets of material, in a selected order, according to the cross-sectional data representing the three-dimensional object to be formed. LOM is described in U.S. Pat. No. 4,752,352, issued Jun. 21, 1988, to Feygin, U.S. Pat. No. 5,015,312, issued May 14, 1991, to Kinzie, and U.S. Pat. No. 5,192,559, issued Mar. 9, 1993, to Hull et al.; and in PCT Publication No. WO 95-18009, published Jul. 6, 1995, by Morita.

Though, as noted above, the techniques of the instant invention are directed primarily to liquid-based stereolithography object formation, it is believed that some of the techniques may have application in the LOM and/or SDM technologies where application of a beam or other laminae forming element must be precisely controlled.

Needs exist in the stereolithographic arts for improved beam generation techniques and positioning techniques. A first need exists for enhanced effective life of solid state ultraviolet producing lasers in a stereolithographic system. A second need exists for maintaining substantially uniform exposure over the length of each vector while simultaneously scanning as fast as possible, maintaining adequate positional control and minimizing the overall exposure time. A third need exists for improved control of the laser power that is produced and applied to the building material in a stereolithographic system. A fourth need exists for improved efficiency in exposing the building material in a stereolithographic system when exposure is controlled by a plurality of different vector types. A fifth need exists for simplified techniques for determining the maximum useful laser power for exposing a given set of vectors.

2. Other Related Patents and Applications

The patents, applications, and publications mentioned above and hereafter are all incorporated by reference herein as if set forth in full. Table 1 provides a listing of patents and applications co-owned by the assignee of the instant application. A brief description of subject matter found in each patent and application is included in the table to aid the reader in finding specific types of teachings. It is not intended that the incorporation of subject matter be limited to those topics specifically indicated, but instead the incorporation is to include all subject matter found in these applications and patents. The teachings in these incorporated references can be combined with the teachings of the instant application in many ways. For example, the references directed to various data manipulation techniques may be combined with the teachings herein to derive even more useful, modified object data that can be used to more accurately and/or efficiently form objects. As another example, the various apparatus configurations disclosed in these references may be used in conjunction with the novel features of the instant invention.

TABLE 1

Related Patents and Applications

| Patent No. Issue Date Application No. Filing Date | Inventor | Subject |
|---|---|---|
| 4,575,330 Mar 11, 1986 06/638,905 Aug 8, 1984 | Hull | Discloses fundamental elements of stereolithography. |
| 4,999,143 Mar 12, 1991 07/182,801 Apr 18, 1988 | Hull, et al. | Discloses various removable support structures applicable to stereolithography. |
| 5,058,988 Oct 22, 1991 07/268,816 Nov 8, 1988 | Spence | Discloses the application of beam profiling techniques useful in stereolithography for determining cure depth and scanning velocity, etc. |
| 5,059,021 Oct 22, 1991 07/268,907 Nov 8, 1988 | Spence, et al. | Discloses the utilization of drift correction techniques for eliminating errors in beam positioning resulting from instabilities in the beam scanning system |
| 5,076,974 Dec 31, 1991 07/268,429 Nov 8, 1988 | Modrek, et al. | Discloses techniques for post processing objects formed by stereolithography. In particular exposure techniques are described that complete the solidification of the building material. Other post processing steps are also disclosed such as steps of filling in or sanding off surface discontinuities. |
| 5,104,592 Apr 14, 1992 07/339,246 Apr 17, 1989 | Hull | Discloses various techniques for reducing distortion, and particularly curl type distortion, in objects being formed by stereolithography. |
| 5,123,734 Jun 23, 1992 07/268,837 Nov 8, 1988 | Spence; et al. | Discloses techniques for calibrating a scanning system. In particular techniques for mapping from rotational mirror coordinates to planar target surface coordinates are disclosed |
| 5,133,987 Jul 28, 1992 07/427,885 Oct 27, 1989 | Spence, et al. | Discloses the use of a stationary mirror located on an optical path between the scanning mirrors and the target surface to fold the optical path in a stereolithography system. |
| 5,141,680 Aug 25, 1992 07/592,559 Oct 4, 1990 | Almquist, et al. | Discloses various techniques for selectively dispensing a material to build up three-dimensional objects. |
| 5,143,663 Sep 1, 1992 07/365,444 Jun 12, 1989 | Leyden, et al. | Discloses a combined stereolithography system for building and cleaning objects. |
| 5,174,931 Dec 29, 1992 07/515,479 Apr 27, 1990 | Almquist, et al. | Discloses various doctor blade configurations for use in forming coatings of medium adjacent to previously solidified laminae. |
| 5,182,056 Jan 26, 1993 07/429,911 Oct 27, 1989 | Spence, et al. | Discloses the use of multiple wavelengths in the exposure of a stereolithographic medium. |
| 5,182,715 Jan 26, 1993 07/824,81 9 Jan 22, 1992 | Vorgitch, et al. | Discloses various elements of a large stereolithographic system. |
| 5,184,307 Feb 2, 1993 07/331,644 Mar 31, 1989 | Hull, et al. | Discloses a program called Slice and various techniques for converting three-dimensional object data into data descriptive of cross-sections. Disclosed techniques include linewidth compensation techniques (erosion routines), and object sizing techniques. The application giving rise to this patent included a number of appendices that provide further details regarding stereolithography methods and systems. |

TABLE 1-continued

Related Patents and Applications

| Patent No. Issue Date Application No. Filing Date | Inventor | Subject |
|---|---|---|
| 5,192,469 Mar 9, 1993 07/606,802 Oct 30, 1990 | Hull, et al. | Discloses various techniques for forming three-dimensional object from sheet material by selectively cutting out and adhering laminae. |
| 5,209,878 May 11, 1993 07/605,979 Oct 30, 1990 | Smalley, et al. | Discloses various techniques for reducing surface discontinuities between successive cross-sections resulting from a layer-by-layer building technique. Disclosed techniques include use of fill layers and meniscus smoothing. |
| 5,234,636 Aug 10, 1993 07/929,463 Aug 13, 1992 | Hull, et al. | Discloses techniques for reducing surface discontinuities by coating a formed object with a material, heating the material to cause it to become flowable, and allowing surface tension to smooth the coating over the object surface. |
| 5,238,639 Aug 24, 1993 07/939,549 Mar 31, 1992 | Vinson, et al. | Discloses a technique for minimizing curl distortion by balancing upward curl to downward curl. |
| 5,256,340 Oct 26, 1993 07/906,207 Jun 25, 1992 and 08/766,956 Dec 16, 1996 | Allison, et al. | Discloses various build/exposure styles for forming objects including various techniques for reducing object distortion. Disclosed techniques include: (1) building hollow, partially hollow, and solid objects, (2) achieving more uniform cure depth, (3) exposing layers as a series of separated tiles or bullets, (4) using alternate sequencing exposure patterns from layer to layer, (5) using staggered or offset vectors from layer to layer, and (6) using one or more overlapping exposure patterns per layer. |
| 5,321,622 Jun 14, 1994 07/606,191 Oct 30, 1990 | Snead, et al. | Discloses a computer program known as CSlice which is used to convert three-dimensional object data into cross-sectional data. Disclosed techniques include the use of various Boolean operations in stereolithography. |
| 5,597,520 Jan 28, 1997 081233,027 Apr 25, 1994 And 08/428,951 Apr 25, 1995 | Smalley, et al. | Discloses various exposure techniques for enhancing object formation accuracy. Disclosed techniques address formation of high resolution objects from building materials that have a Minimum Solidification Depth greater than one layer thickness and/or a Minimum Recoating Depth greater than the desired object resolution. |
| 08/722,335 Sep 27, 1996 Now abandoned | Leyden, et al. | Discloses build and support styles for use in a Multi-Jet Modeling selective deposition modeling system. |
| 08/722,326 Sep 27, 1996 | Earl, et al. | Discloses data manipulation and system control techniques for use in a Multi-Jet Modeling selective deposition modeling system. |
| 5,902,537 May 11, 1999 08/790,005 Jan 28, 1997 | Almquist, et al. | Discloses various recoating techniques for use in stereolithography. Disclosed techniques include 1) an ink jet dispensing device, 2) a fling recoater, 3) a vacuum applicator, 4) a stream recoater, 5) a counter rotating roller recoater, and 6) a technique for deriving sweep extents. |
| 5,840,239 Nov 24, 1998 08/792,347 Jan 31, 1997 | Partanen, et al. | Discloses the application of solid-state lasers to stereolithography. Discloses the use of a pulsed radiation source for solidifying layers of building material and in particular the ability to limit pulse firing locations to only selected target locations on a surface of the medium. |
| 6,001,297 Dec 14, 199 08/847,855 Apr 28, 1997 | Partanen, et al. | Discloses the stereolithographic formation of objects using a pulsed radiation source where pulsing occurs at selected positions on the surface of a building material. |
| 08/855,125 May 13, 1997 | Nguyen, et al. | Discloses techniques for interpolating originally supplied cross-sectional data descriptive of a three-dimensional object to produce modified data descriptive of the three-dimensional object including data descriptive of intermediate regions between the originally supplied cross-sections of data. |
| 5,945,058 Aug 31, 1999 08/854,950 May 13, 1997 | Manners, et al. | Discloses techniques for identifying features of partially formed objects. Identifiable features include trapped volumes, effective trapped volumes, and solid features of a specified size. The identified regions can be used in automatically specifying recoating parameters and or exposure parameters. |
| 5,902,538 May 11, 1999 08/920,428 | Kruger, et al. | Discloses simplified techniques for making high-resolution objects utilizing low-resolution materials that are limited by their inability to reliably form coatings of a desired thickness |

TABLE 1-continued

Related Patents and Applications

| Patent No. Issue Date Application No. Filing Date | Inventor | Subject |
|---|---|---|
| Aug 29, 1997 | | due to a Minimum Recoating Depth (MRD) limitation. Data manipulation techniques define layers as primary or secondary. Recoating techniques are described which can be used when the thickness between consecutive layers is less than a leading edge bulge phenomena. |
| 09/061,796 Apr 16, 1998 | Wu, et al. | Discloses use of frequency converted solid state lasers in stereolithography. |
| 09/154,967 Sep 17, 1998 | Nguyen, et al. | Discloses techniques for stereolithographic recoating using a sweeping recoating device that pause and/or slows down over laminae that are being coated over. |
| 09/484,984 Jan 18, 2000 | Earl, et al. | Entitled "Method and Apparatus for Forming Three-Dimensional Objects Using Line Width Compensation with Small Feature Retention." Discloses techniques for forming objects while compensating for solidification width induced in a building material by a beam of prescribed stimulation. |
| 09/246,504 filed Feb 8, 1999 concurrently herewith | Guertin, et al. | Entitled "Method and Apparatus for Stereolithographically Forming Three Dimensional Objects With Reduced Distortion." Discloses techniques for forming objects wherein a delay is made to occur between successive exposures of a selected region of a layer. |
| 09/248,352, filed Feb 8, 1999 concurrently herewith | Manners, et al. | Entitled Stereolithographic Method and Apparatus for Production of Three Dimensional Object Using Multiple Beams of Different Diameters" Discloses stereolithographic techniques for forming objects using multiple sized beams including data manipulation techniques for determining which portions of lamina may be formed with a larger beam and which should be formed using a smaller beam. |
| 09/248,351, filed Feb 8, 1999 concurrently herewith | Nguyen, et al. | Entitled "Stereolithographic Method and Apparatus for Production of Three Dimensional Objects Using Recoating Parameters for Groups of Layers." Discloses improved techniques for managing recoating parameters when forming objects using layer thicknesses smaller than a minimum recoating depth (MRD) and treating some non-consecutive layers as primary layers and treating intermediate layers there between as secondary layers. |
| 09/246,416, filed Feb 8, 1999 concurrently herewith | Bishop, et al. | Entitled "Rapid Prototyping Apparatus with Enhanced Thermal and Vibrational Stability for Production of Three Dimensional Objects." Discloses an improved Stereolithographic apparatus structure for isolating vibration and or extraneous heat producing components from other thermal and vibration sensitive components. |
| 09/247,113, filed Feb 8, 1999 concurrently herewith | Chari, et al. | Entitled "Stereolithographic Method and Apparatus for production of Three Dimensional Objects with Enhanced thermal Control of the Build environment. Discloses improved stereolithographic techniques for maintaining build chamber temperature at a desired level. The techniques include varying heat production based on the difference between a detected temperature and the desired temperature. |
| 09/247,119, filed Feb 8, 1999 concurrently herewith | Kulkarni, et al. | Entitled "Stereolithographic Method and Apparatus for Production of Three Dimensional Objects Including Simplified Build Preparation." Discloses techniques for forming objects using a simplified data preparation process. Selection of the various parameter styles needed to form an object is reduced to answering several questions from lists of possible choices. |

The following two books are also incorporated by reference herein as if set forth in full: (1) *Rapid Prototyping and Manufacturing: Fundamentals of Stereolithography*, by Paul F. Jacobs; published by the Society of Manufacturing Engineers, Dearborn Mich.; 1992; and (2) *Stereolithography and other RP&M Technologies: from Rapid Prototyping to Rapid Tooling*; by Paul F. Jacobs; published by the Society of Manufacturing Engineers, Dearborn Mich.; 1996.

SUMMARY OF THE INVENTION

An object of the invention is to simplify techniques for determining the maximum useful laser power for exposing a given set of vectors.

It is a first aspect of the invention to provide a method of forming a three-dimensional object from a plurality of adhered laminae by exposing successive layers of a material to a beam of prescribed stimulation, including (a) providing a pulsed beam of prescribed stimulation, having a pulse repetition rate, a desired beam diameter, and a desired beam power for use in exposing each vector in a given set of vectors; (b) providing a plurality of vector types for exposing layers of material; (c) providing a desired maximum scan speed for at least one vector type in the set; (d) deriving a top scan speed based on the pulse repetition rate and beam diameter; (e) resetting, to the top speed, any desired maximum scan speed derived in (c) that exceeds the top speed; (f) using each maximum speed as reset in (e) or as remaining from (c) to derive a maximum laser power; (g) setting the desired beam power to an amount equal to or less than the smallest maximum laser power derived in (f); (h) forming a layer of material adjacent to any last formed layer of material in preparation for forming a subsequent lamina of the object; (i) exposing the layer, to the beam of prescribed stimulation having the desired beam power, under the control the set of vectors; and (j) repeating the acts of forming and exposing a plurality of times in order to form the object from a plurality of adhered laminae.

A second aspect of the invention provides a stereolithographic apparatus for forming a three-dimensional object from a plurality of adhered laminae by exposing successive layers of a material to a beam of prescribed stimulation, including: (a) means for providing a pulsed beam of prescribed stimulation, having a pulse repetition rate, a desired beam diameter, and a desired beam power for use in exposing each vector in a given set of vectors; (b) means for providing a plurality of vector types for exposing layers of material; (c) means for providing a desired maximum scan speed for at least one vector type in the set; (d) means for deriving a top scan speed based on the pulse repetition rate and beam diameter; (e) means for resetting, to the top speed, any desired maximum scan speed derived in (c) that exceeds the top speed; (f) means for using each maximum speed as reset in (e) or as remaining from (c) to derive a maximum laser power; (g) means for setting the desired beam power to an amount equal to or less than the smallest maximum laser power derived in (f); (h) means for forming a layer of material adjacent to any last formed layer of material in preparation for forming a subsequent lamina of the object; (i) means for exposing the layer, to the beam of prescribed stimulation having the desired beam power, under the control the set of vectors; and (j) means for operating the means for forming and means for exposing a plurality of times in order to form the object from a plurality of adhered laminae.

A third aspect of the invention provides a stereolithographic apparatus for forming a three-dimensional object from a plurality of adhered laminae by exposing successive layers of a material to a beam of prescribed stimulation, including: (a) a source of a pulsed beam of prescribed stimulation, having a pulse repetition rate, a desired beam diameter, and a desired beam power for use in exposing each vector in a given set of vectors; (b) a computer programmed to provide a plurality of vector types for exposing layers of material; (c) a memory for holding a desired maximum scan speed for at least one vector type in the set; (d) a computer programmed to: (1) derive a top scan speed based on the pulse repetition rate and beam diameter; (2) reset, to the top speed, any desired maximum scan speed derived in (c) that exceeds the top speed; (3) use each maximum speed as reset in (d)(2) or as remaining from (c) to derive a maximum laser power; (4) set the desired beam power to an amount equal to or less than the smallest maximum laser power derived in (d)(3); (e) a recoating system for forming a layer of material adjacent to any last formed layer of material in preparation for forming a subsequent lamina of the object; (f) an exposure system for exposing the layer, to the beam of prescribed stimulation having the desired beam power, under the control the set of vectors; and (g) a computer programmed to operate the recoating system and the exposure system to form the object from a plurality of adhered laminae.

Other aspects of the invention supply apparatus for implementing the method aspects of the invention noted above.

Additional objects and aspects of the invention will be clear from the embodiments of the invention described below in conjunction with the Figures associated therewith.

BRIEF DESCRIPTION OF DRAWINGS

FIGS. 5-A and 5-B depict a flow chart of a preferred embodiment.

DESCRIPTION OF PREFERRED EMBODIMENTS OF THE INVENTION

Figure 1A:
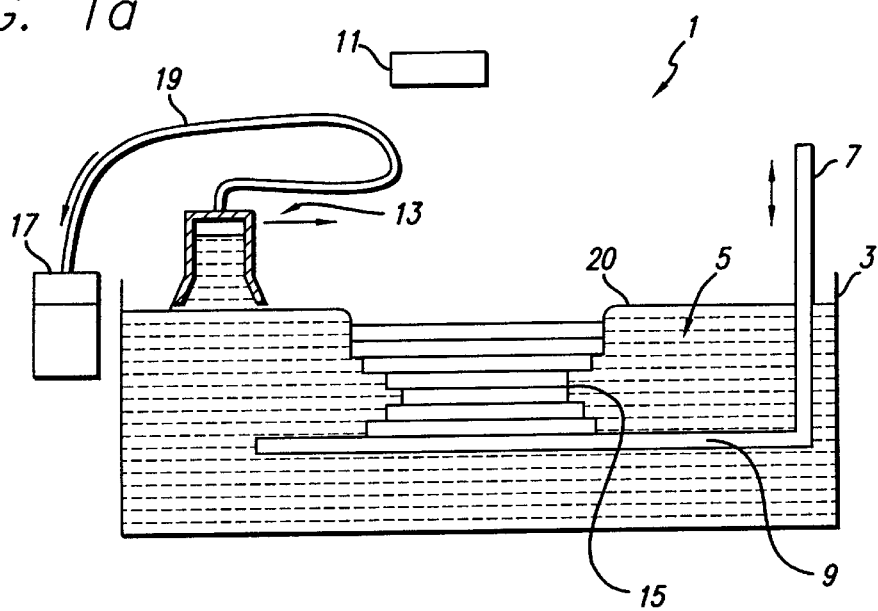
FIGS. 1a and 1b depict side views of a stereolithography apparatus for practicing the instant invention.
Figure 1B:
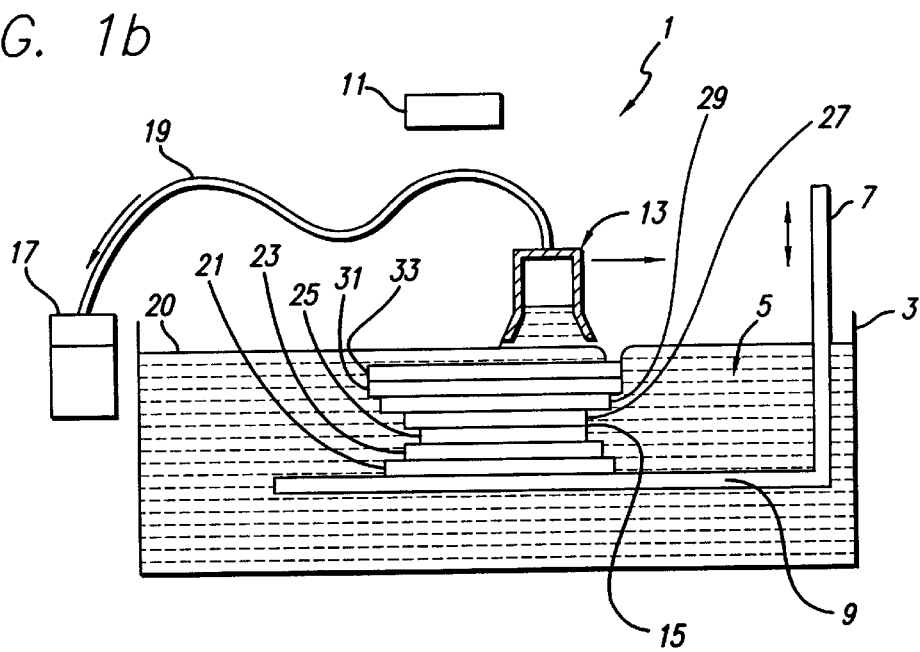

FIGS. 1a and 1b depict schematic representations of a preferred stereolithography apparatus 1 (SLA) for use with the instant invention. The basic components of an SLA are described in U.S. Pat. Nos. 4,575,330; 5,184,307; and 5,182,715 as referenced above. The preferred SLA includes container 3 for holding building material 5 (e.g. photopolymer) from which object 15 will be formed, elevator 7 and driving means (not shown), elevator platform 9, exposure system 11, recoating bar 13 and driving means (not shown), at least one computer (not shown) for manipulating object data (as needed) and for controlling the exposure system, elevator, and recoating device.

FIG. 1a depicts the partially formed object as having its most recently formed lamina lowered to a position approximately one layer thickness below the desired level of the upper surface of the building material 5 (i.e. desired working surface). As the layer thickness is small and the building material very viscous, FIG. 1a indicates that the material has not flowed significantly across the last formed lamina even after lowering the platform 9. FIG. 1b depicts the coating bar 13 as being swept part way across the previously formed lamina and that the next layer of building material has been partially formed.

A preferred exposure system is described in several of the patents and applications referenced above including U.S. Pat. Nos. 5,058,988; 5,059,021; 5,123,734; 5,133,987; 5,840,239; and Ser. No. 09/247,120. This preferred system includes a laser, a beam focusing system, and a pair of computer controlled XY rotatable scanning mirrors of either the motor driven or galvanometer type.

Figure 1C:
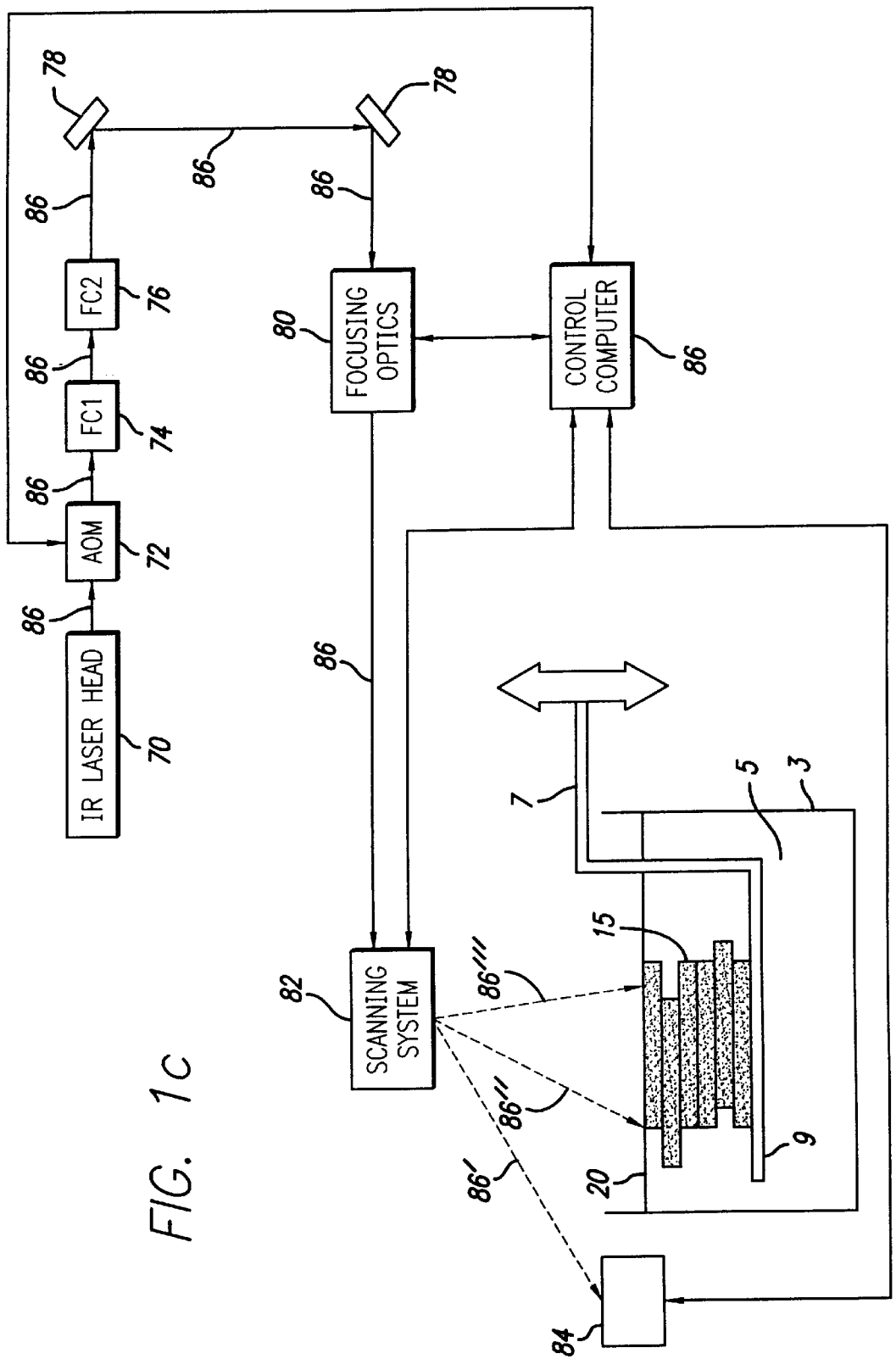
FIG. 1c depicts a block diagram illustrating some major components of the stereolithography system.

FIG. 1c provides a block diagram of selected elements of a preferred stereolithography system 1 wherein like elements are identified with like numerals. The exposure system includes an IR laser head 70, that produces a pulsed beam of radiation operating a desired repetition pulse repetition rate (e.g. 22.5–40 KHz). The exposure system further includes, an AOM 72, a first frequency conversion crystal 74, a second frequency conversion crystal 76, two folding mirrors 78, focusing optics 80, a pair of XY scanning mirrors 82, and a detector 84. A control computer 86 is provided to preferably control, among other things, the scanning mirrors 82, the AOM 72, the detector 84, and the focusing optics 80. The optical path is depicted with reference numeral 86. The computer preferably controls the above noted components based on object data that has been modified for stereolithographic formation. It is preferred that the focusing optics be controlled to produce two or more beam diameters for forming object laminae. The AOM is preferably controlled to adjust beam power base on a plurality of criteria including beam size.

The scanning mirrors are used to selectively direct the beam path to desired locations onto the surface of the building material 5 or onto other items such as detector 84. The optical path beyond the scanning mirrors is depicted with reference numerals 86', 86", or 86''' as examples of the different directions in which the beam may be directed. The AOM is used to set the beam power that is allowed to proceed from the IR laser head 70 to the first and second frequency conversion crystals. The beam that is allowed to proceed to the frequency conversion crystals is sent along a first order beam path from the AOM. The other beam path orders (e.g. $0^{th}$ and $2^{nd}$) are inhibited from progressing to the frequency conversion crystals. The focusing optics are used to obtain a desired focus and/or beam diameter at the surface 20 of the building material 5.

Figure 1D:
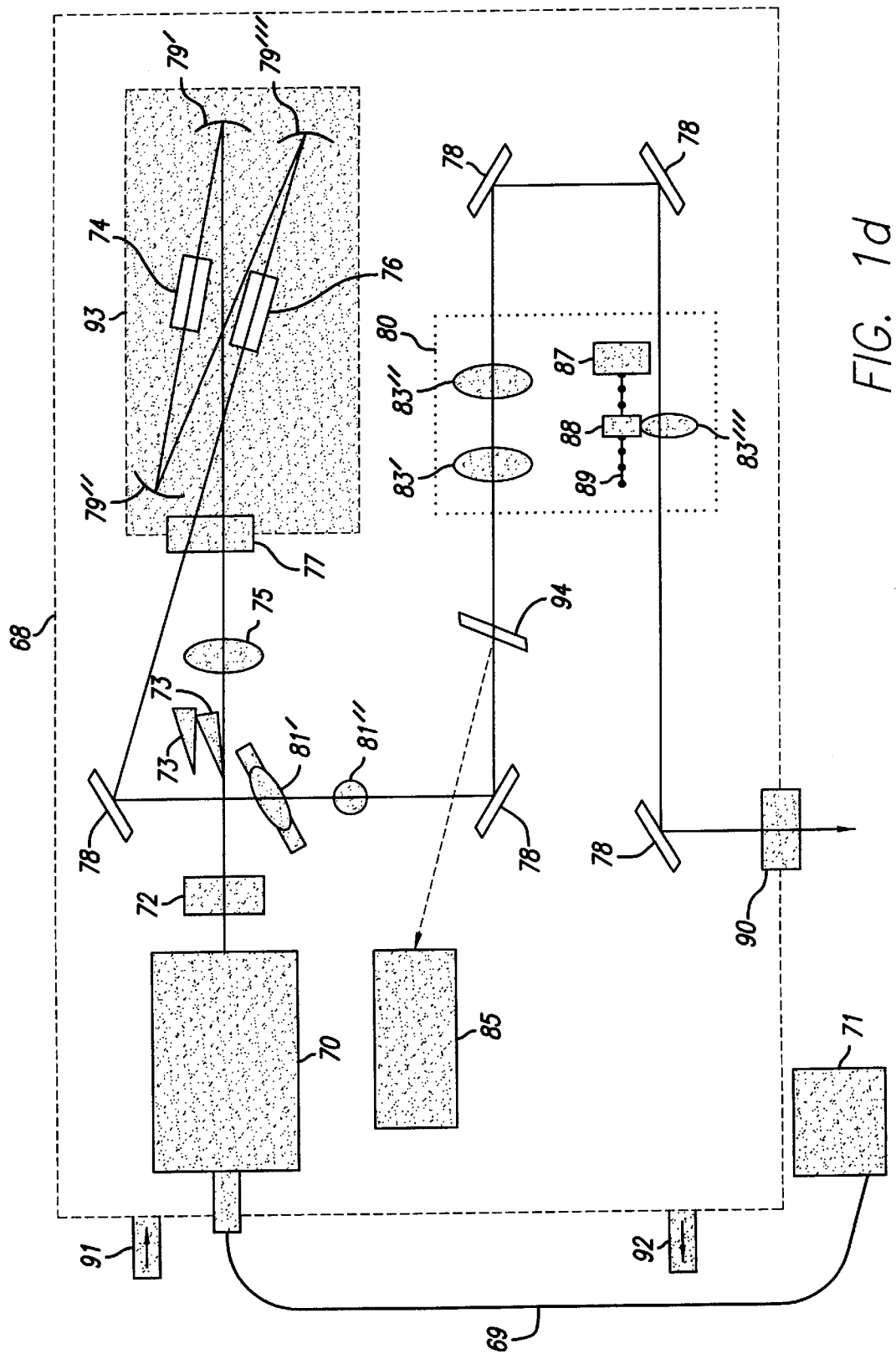
FIG. 1d depicts a schematic diagram illustrating the major components in the laser head and the beam path followed through the laser head.

A more detailed depiction of the beam-generating portion of the exposure system is depicted in FIG. 1d wherein like numerals to those used in the other figures depict similar components. The radiation-generating portion of the exposure system comprises a laser head 68, IR generating laser diodes 71, and a fiber optic cable 69. The laser diodes produce approximately 808 nm radiation at approximately 18 watts. The fiber optic cable directs the output of the laser diodes 71 to an IR laser 70 inside the UV laser head, the radiation from the fiber optic is used to supply pumping radiation to the IR laser 70. The laser 70 produces 1.064 micron radiation that is directed to acousto-optic modulator (AOM) 72 that is used to control the beam power by deflecting varying amounts of the beam power along different optical paths. A zeroth order optical path directs the beam into a beam dump; for example, a trap formed by two triangular shaped elements 73. A first order optical path directs the beam through a half-wave plate 75 that rotates the polarization of the beam.

From the half wave plate 75 the beam enters a frequency conversion module 93 through an aperture 77. From aperture 77 the beam proceeds to focusing mirror 79'. From mirror 79' the beam proceeds through a first frequency conversion crystal 74. This first crystal 74 converts a portion of the first beam into a beam that has double the frequency. The remaining portion of the original beam and the beam of doubled frequency proceed to second focusing mirror 79", then a third focusing mirror 79''', and then through a second frequency conversion crystal 76. The second crystal 76 generates a third beam of tripled frequency compared to the original beam that entered first crystal 74. A beam containing all three frequencies then proceeds out of the conversion module 93 through aperture 77. The mirrors 78 and other optical elements are wavelength selective and cause the remaining portions of the original and doubled frequency beams to attenuate. As such, only the tripled frequency portion of the beam proceeds along the rest of the beam path through laser head 68.

From aperture 77 the beam proceeds to folding mirror 78, and continues through cylindrical lens 81' and 81". The cylindrical lenses are used to remove astigmatism and excess ellipticity from the beam. Excess ellipticity is determined based on an aspect ratio of the beam that is defined as the ratio of minimum beam dimension at a focal plane and the maximum beam dimension at the focal plane. An aspect ratio of one implies the beam is circular while an aspect ratio of 1.1 or 0.9 implies that the width of the beam in one dimension is approximately 10% greater than or less than the width in the other dimension. Aspect ratios in excess of 1.1 or 0.9 are generally considered excessive though in some circumstances the beams may be useable.

From cylindrical lens 81" the beam proceeds to folding mirror 78. Most of the beam then proceeds through beam splitter 94, while a very small portion (e.g. around 1–4%) is reflected from the beam splitter back to detector 85 where a power measurement may be taken which can then be used in determining the overall power in the beam. The main portion of the beam moves through lenses 83' and 83" in the beam focusing module 80. After passing through lens 83" the beam direction is reoriented by two folding mirrors 78.

The beam then reenters the focusing module and passes through movable lens 83'''. The position of lens 83''' is controlled by stepper motor 87, moveable mount 88, and lead screw 89. The motor is computer controlled so that the beam focal plane may be varied depending on the desired beam size at the surface of the building material.

It is preferred that the focus system be precalibrated so that adjustment from one beam size to another may be accomplished without delay. In this regard it is preferred that an encoder provide stepper motor position and that the computer contain a table of encoder positions corresponding to different desired beam sizes. Based on values in the look up table, the stepper motor can be commanded to move to a new position based on a difference between present position and desired position. Once the new position is reached, if desired, the actual beam diameter may be checked using a beam profiling system as described in previously referenced U.S. Pat. No. 5,058,988. Various alternative approaches to setting beam size will be apparent to those of skill in the art.

The beam then proceeds to folding mirror 78 and out exit window 90 where after the beam encounters the scanning mirrors or other optical components. The beam produced by this laser head is pulsed at a useable frequency (e.g. 22.5–40 KHz or more). The laser head is preferably water cooled by passing water in through the base plate that supports the components depicted in FIG. 1d. The water preferably enters the plate through orifice 91 proceeds along a winding flow path and then exits the plate at orifice 92.

A laser power supply may be used to control operation of the laser in several ways: (1) it supplies a desired amount of electric power to the laser diodes 71 to produce a desired optical output (e.g. about 18 watts), (2) it controls thermal electric heaters/coolers or other heaters/coolers to control the temperatures of the laser diodes, the IR laser, and/or the conversion crystals, (3) it may control the AOM Q-switch, (4) it may control the focusing system, (5) it may be used to control the detector and to interpret signals therefrom. Alternatively, or additionally, the process computer may be used to control one or more of the above noted elements. The process computer preferably is functionally connected to the laser power supply so that it may further control laser operation.

A preferred laser head, IR module, and power supply is sold by Spectra-Physics of Mountain View, Calif., as part number J30E-BL10-355Q-11 or J30E-BL6-355Q-11.

The water passing through the base plate is also preferably used to cool the IR laser diodes 71. It is preferred that the water pass through the base plate prior to passing on to the laser diodes 71. The water may be recirculated through an enclosed cooling system or other recirculating or non-recirculating system. Various alternatives to water cooling are possible and will be apparent to those of skill in the art.

Preferred control and data manipulation systems and software are described in a number of the patents referenced above, including U.S. Pat. Nos. 5,184,307; 5,321,622; and 5,597,520.

Referring now to FIGS. 1a and 1b, a preferred recoating device is described in U.S. Pat. No. 5,902,537 as referenced above and includes recoater bar 13, regulated vacuum pump 17, and vacuum line 19 connecting the bar 13 and the pump 17.

Other components of a preferred SLA (not shown) may include a liquid level control system, a build chamber, an environmental control system including a temperature control system, safety interlocks, a viewing device, and the like.

SLAs on which the instant invention can be utilized are available from 3D Systems, Inc. of Valencia, Calif. These SLAs include the SLA-250 using a CW HeCd laser operating at 325 nm, the SLA-3500, SLA-5000, and the SLA-7000 using solid state lasers operating at 355 nm with a pulse repetition rates of 22.2 KHz, 40 KHz, and 25 KHz, respectively. Preferred building materials are photopolymers manufactured by CIBA Specialty Chemicals of Los Angeles, Calif., and are available from 3D Systems, Inc. These materials include SL 5170, SL 5190, and SL 5530HT.

The typical operation of an SLA involves alternating formation of coatings of material (i.e. layers of material) and the selective solidification of those coatings to form an object from a plurality of adhered laminae. The process may conceptually be viewed as beginning with the elevator platform 9 immersed one layer thickness below the upper surface 20 of the photopolymer 5. The coating of photopolymer is selectively exposed to prescribed stimulation (e.g. a beam of UV radiation) which cures the material to a desired depth to form an initial lamina of the object adhered to the elevator platform. This initial lamina corresponds to an initial cross-section of the object to be formed or corresponds to an initial cross-section of supports that may be used to adhere the object to the platform. After formation of this initial lamina, the elevator platform and adhered initial lamina are lowered a net amount of one layer thickness into the material.

Hereinafter, layer thickness and other units of distance may be expressed in any of three units: (1) inches, (2) milli-inches (i.e. mils), or (3) millimeters. As the material is typically very viscous and the thickness of each layer is very thin (e.g. 4 mils to 10 mils), the material may not readily form a coating over the last solidified lamina (as shown in FIG. 1a). In the case where a coating is not readily formed, a recoating device may be swept at or somewhat above the surface of the building material (e.g. liquid photopolymer) to aid in the formation of a fresh coating. The coating formation process may involve the sweeping of the recoating bar one or more times at a desired velocity.

After formation of this coating, the second layer is solidified by a second exposure of the material to prescribed stimulation according to data representing a second cross-section of the object. This process of coating formation and solidification is repeated over and over again until the object is formed from a plurality of adhered layers (21, 23, 25, 27, 29, 31, and 33).

In some building techniques, incomplete solidification of some or all object cross-sections may occur. Alternatively, in some processes an object lamina associated with a given layer (i.e. a lamina whose location should be positioned, relative to the rest of the object, at the level corresponding to that layer of material) may not be exposed or may be only partially exposed in association with that layer (i.e. when that layer is located at the surface of the liquid). Instead, that lamina may be formed in whole or in part in association with a subsequently formed layer wherein the exposure applied to this subsequent layer is such as to cause material transformation to such an extent as to cause solidification in the material at the level of the associated cross-section. In other words, the layer which is associated with a given lamina may not be the layer in association with which the lamina will be solidified. It may be said that the layer in association with which a lamina or portion of a lamina is formed, is that layer which is located at the surface of material at the time the lamina is solidified. The layer with which a lamina is associated, is that layer which corresponds to the dimensionally correct location of the lamina relative to the rest of the object.

Figure 2A:
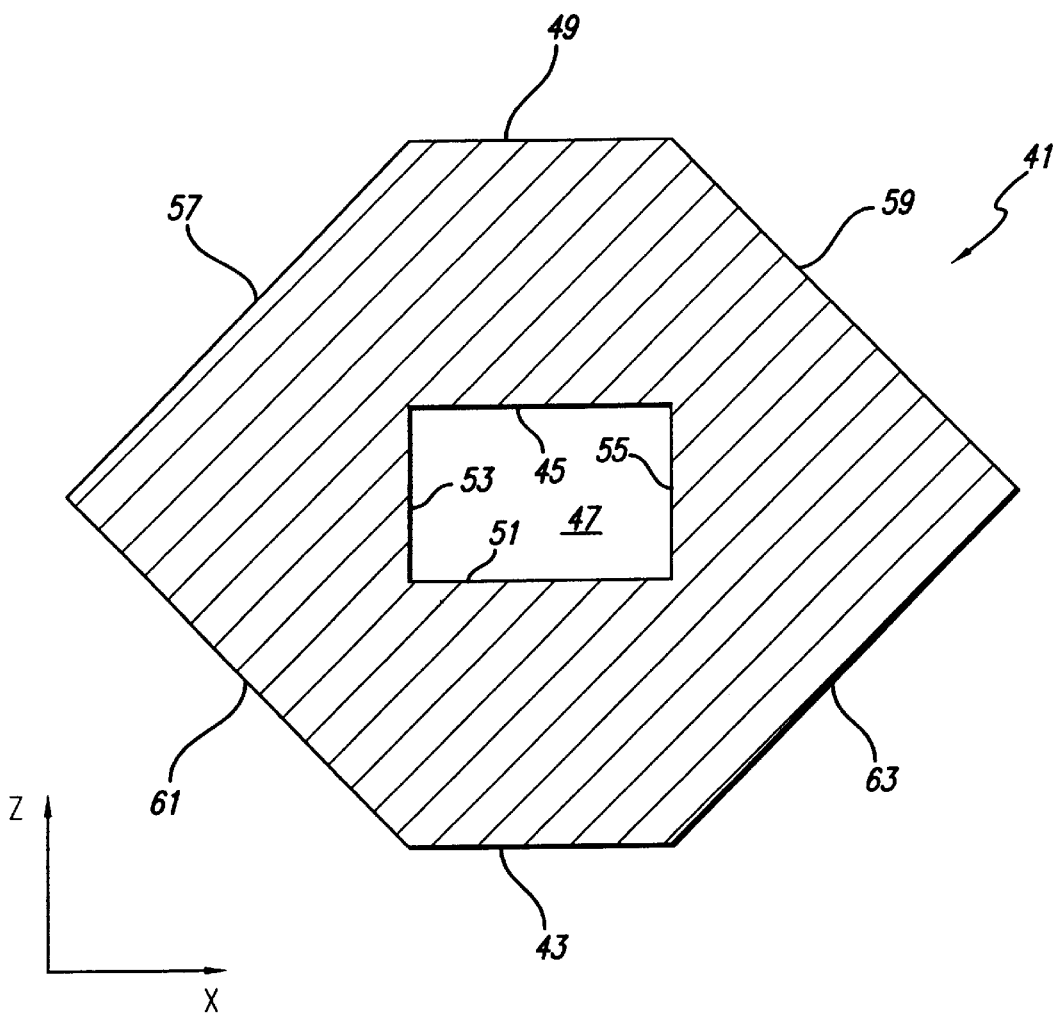
FIG. 2a depicts a side view of an object to be formed using stereolithography.

FIG. 2a depicts a side view of an object 41 to be produced stereolithographically. In terms of forming horizontal layers, this figure depicts the vertical axis (Z) and one of the horizontal axes (X). This object will be used to illustrate some aspects of a preferred embodiment and alternative embodiment of the instant invention. This object includes two horizontal (i.e. flat) down-facing features: one at the bottom 43 of the object and the other at the upper edge 45 of the hole 47 through the middle of the object. Similarly, this object includes two horizontal (i.e. flat) up-facing features: one at the top 49 of the object and the other at the lower edge 51 of the hole 47 through the middle of the object. This object includes two vertical walls 53 and 55 located on either side of hole 47. This object also includes two non-horizontal (sometimes called, near flat) up-facing regions 57 and 59 located on either side of the object and two non-horizontal down-facing regions 61 and 63 located on either side of the object.

Figure 2B:
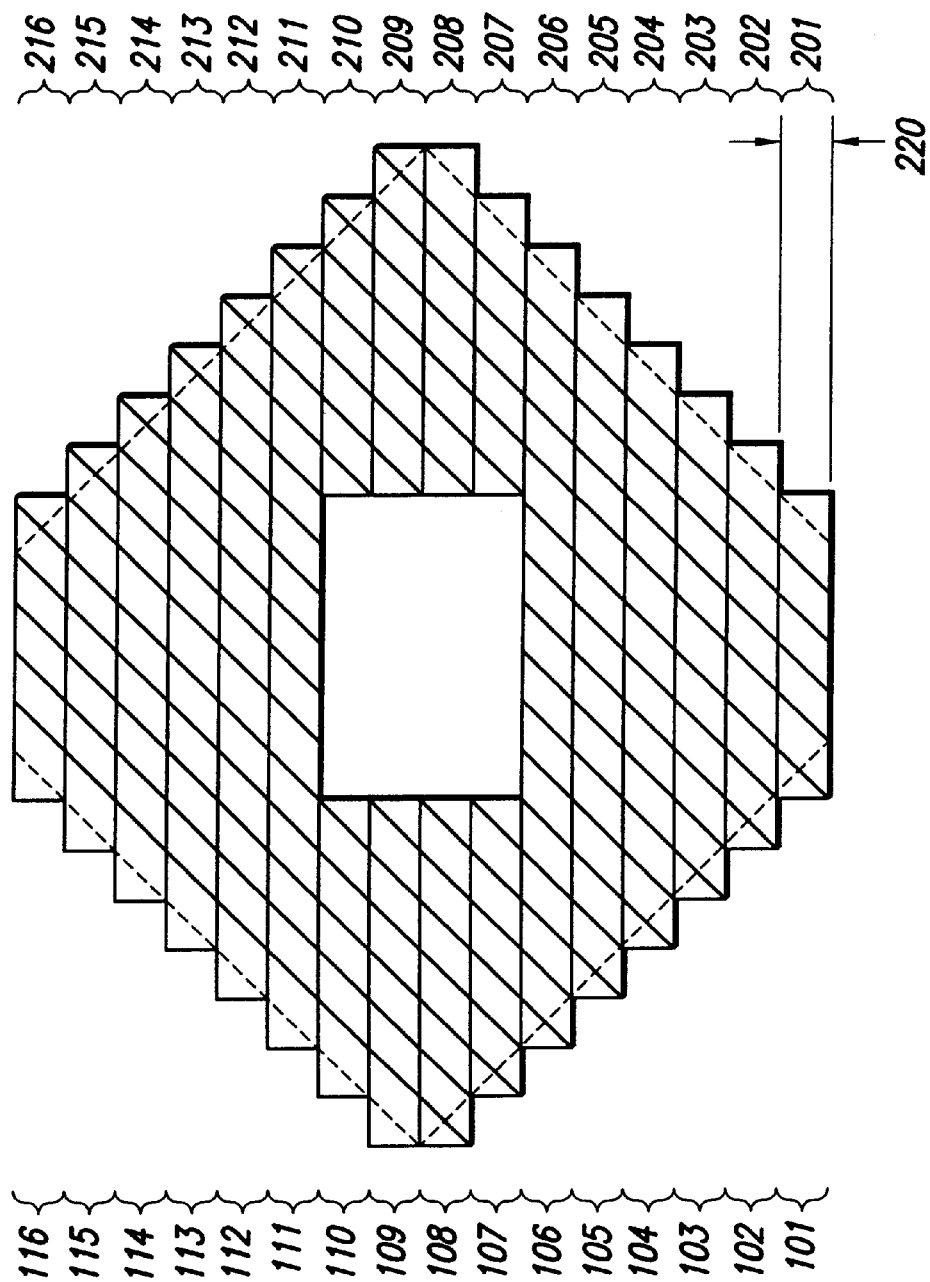
FIG. 2b depicts a side view of the object of FIG. 2a formed using stereolithography.

FIG. 2b illustrates the object as it might be formed with a desired resolution using stereolithography wherein the MSD and MRD (discussed in U.S. Pat. Nos. 5,597,520 and 5,902,538) of the material are both less than or equal to the desired layer thickness (i.e. resolution). In this example, the thickness 220 of each layer is the same. As indicated, the object is formed from 16 adhered laminae 101–116 and 16 associated layers of material 201–216. As layers are typically solidified from their upper surface downward, it is typical to associate cross-sectional data, lamina and layer designations with the upper extent of their positions. To ensure adhesion between laminae, at least portions of each lamina are typically provided with a quantity of exposure that yields a cure depth of more than one layer thickness. In some circumstances use of cure depths greater than one layer thickness may not be necessary to attain adhesion. To optimize accuracy it is typical to manipulate the object data to account for an MSD greater than one layer thickness or to limit exposure of down-facing regions so that they are not cured to a depth of more than one layer thickness.

A comparison of FIGS. 2a and 2b indicates that the object as reproduced in this example is oversized relative to its original design. Vertical and Horizontal features are positioned correctly; but those features that are sloped or near flat (neither horizontal nor vertical), have solidified layers whose minimal extent touches the envelope of the original design and whose maximum extent protrudes beyond the original design. Further discussion of data association, exposure, and sizing issues can be found in U.S. Pat. Nos. 5,184,307 and 5,321,622 as well as a number of other patents referenced above.

Figure 2C:
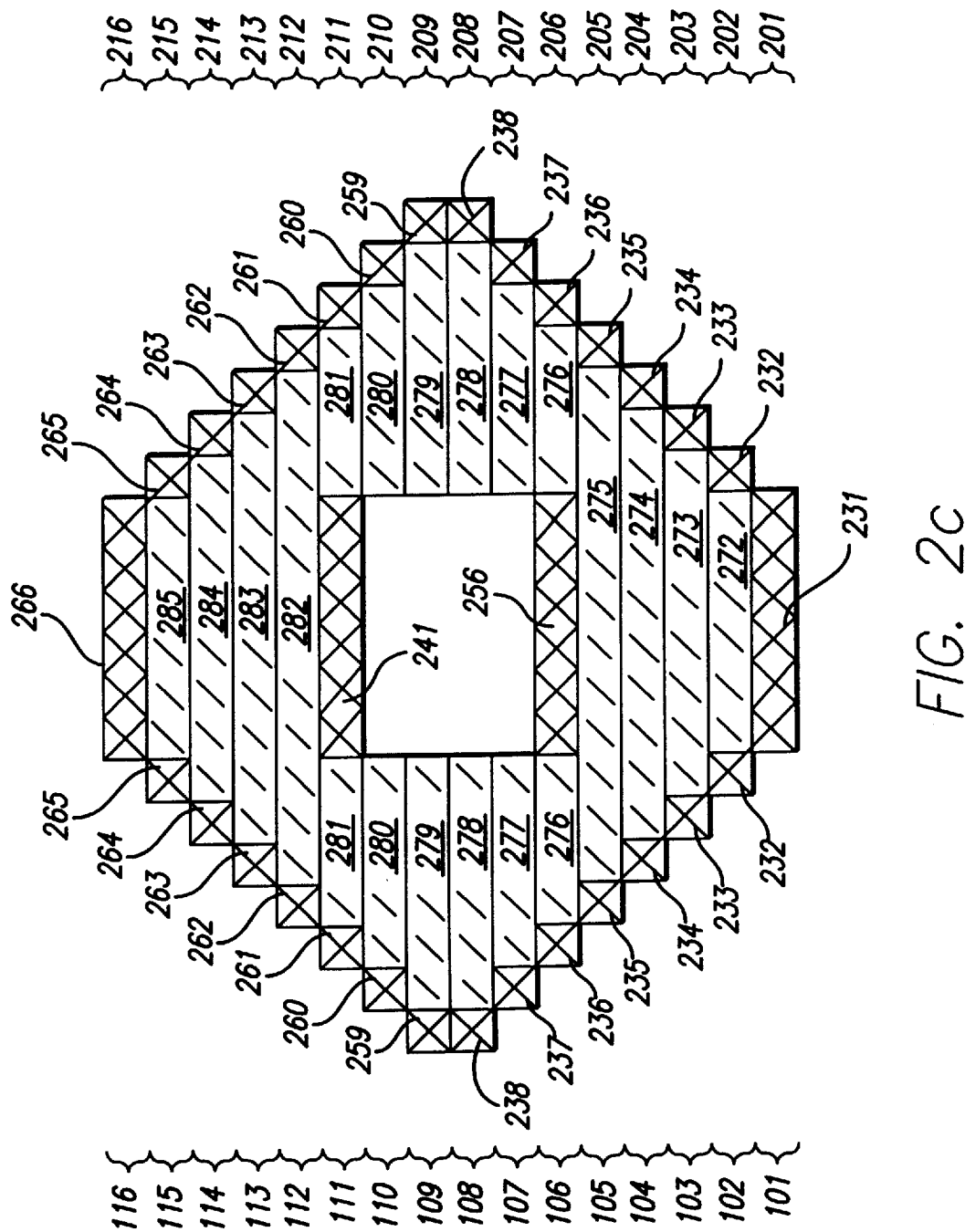
FIG. 2c depicts a side view of the object of FIG. 2b where the different exposure regions associated with each layer are depicted.

FIG. 2c depicts the object as produced in FIG. 2b but with various regions of the object and object laminae distinguished. In one classification scheme (as described in U.S. Pat. No. 5,321,622) each lamina of the object can be made up of one, two or three different regions: (1) down-facing regions; (2) up-facing regions, and (3) continuing regions (i.e. regions that are neither down-facing nor up-facing). In this scheme, the following eight vector types might be utilized though others may be defined and used:

| | |
|---|---|
| Down-facing boundaries | Boundaries that surround down-facing regions of the object. |
| Up-facing boundaries | Boundaries that surround up-facing regions of the object. |
| Continuing boundaries | Boundaries that surround regions of the object that are neither up-facing nor downfacing |
| Up-facing Hatch | Lines of exposure that are positioned within the downfacing boundaries. These lines may be closely or widely spaced from one another and they may extend in one or more directions. |
| Down-facing Hatch | Lines of exposure that are positioned within the up-facing boundaries. These lines may be closely or widely spaced from one another and they may extend in one or more directions. |
| Continuing Hatch | Lines of exposure that are positioned within continuing boundaries. These lines may be closely or widely spaced from one another and they may extend in one or more directions. |
| Down-facing Skin/Fill | Lines of exposure which are positioned within the down-facing boundaries and closely spaced so as to form a continuous region of solidified material. |
| Up-facing Skin/Fill | Lines of exposure which are positioned within the up-facing boundaries and closely spaced so as to form a continuous region of solidified material. |

Taken together, the down-facing boundaries, down-facing hatch, and down-facing fill define the down-facing regions of the object. The up-facing boundaries, up-facing hatch, and up-facing fill, define the up-facing regions of the object. The continuing boundaries and continuing hatch define the continuing regions of the object. As down-facing regions have nothing below them to which adhesion is desirably achieved (other than possibly supports), the quantity of exposure applied to these regions typically does not include an extra amount to cause adhesion to a lower lamina though extra exposure might be given to appropriately deal with any MSD issues that exist. As up-facing and continuing regions have solidified material located below them, the quantity of exposure applied to these regions typically includes an extra amount to ensure adhesion to a lower lamina.

Table 2 outlines the different regions found on each lamina for FIG. 2c.

TABLE 2

Object Regions Existing on Each Lamina of FIG. 2c

| Lamina & Layer | Down-Facing Region(s) | Up-Facing Region(s) | Continuing Region(s) |
|---|---|---|---|
| 101, 201 | 231 | | |
| 102, 202 | 232 | | 272 |
| 103, 203 | 233 | | 273 |
| 104, 204 | 234 | | 274 |
| 105, 205 | 235 | | 275 |
| 106, 206 | 236 | 256 | 276 |
| 107, 207 | 237 | | 277 |
| 108, 208 | 238 | | 278 |
| 109, 209 | | 259 | 279 |
| 110, 210 | | 260 | 280 |
| 111, 211 | 241 | 261 | 281 |
| 112, 212 | | 262 | 282 |
| 113, 213 | | 263 | 283 |
| 114, 214 | | 264 | 284 |
| 115, 215 | | 265 | 285 |
| 116, 216 | | 266 | |

Other schemes for region identification and vector type creation are described in various patents and applications referenced above, including U.S. Pat. Nos. 5,184,307; 5,209,878; 5,238,639; 5,597,520; 5,902,538; 5,943,235; and, application Ser. No. 08/855,125. Some schemes might involves the use of fewer designations such as: (1) defining only outward facing regions and continuing regions where down-facing and up-facing regions are combined to form the outward facing regions; (2) combining all fill types into a single designation; or (3) combining up-facing and continuing hatch into a single designation or even all three hatch types into a single designations. Other schemes might involve the use of more designations such as dividing one or both of the up-facing and down-facing regions into flat regions and near-flat regions.

Other region identifications might involve the identification of which portions of boundaries regions associated with each lamina are outward facing and/or interior to the lamina. Outward facing boundary regions are associated with the Initial Cross-Section Boundaries (ICSB). The ICSB may be considered the cross-sectional boundary regions existing prior to the cross-sections into the various desired regions. ICSBs are described in U.S. Pat. Nos. 5,321,622 and 5,597,520. Interior boundaries are bounded on both sides by object portions of the lamina whereas outward boundaries are bounded on one side by an object portion of the lamina and on the other side by a non-object portion of the lamina.

We next turn our attention to specific preferred embodiments of the instant invention which will be described in view of the preliminary information and background provided above. The headers associated with the following embodiments are intended to aid reading this disclosure but are not intended to isolate or limit the applicability of the teachings herein to those individual embodiments in connection with which explicit disclosure is made.

First Preferred Embodiment

Figure 3:
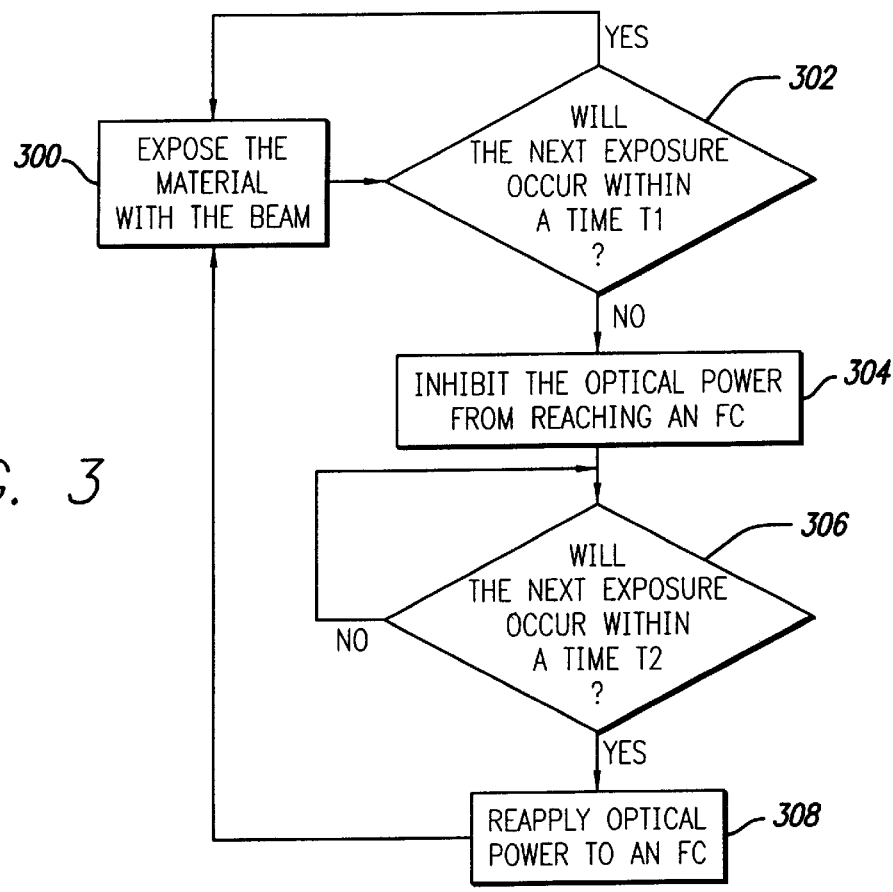
FIG. 3 depicts a flow chart of the process of a preferred embodiment.

FIG. 3 depicts a flowchart for a first preferred embodiment. This embodiment calls for reducing the production of synergistic stimulation during periods of time when the beam is not needed. In this embodiment it is preferred that the beam is not merely inhibited from reaching the surface of the building material, but that the production of the stimulation is reduced, and more preferably ceased, during these periods.

Element 300 indicates that the building material is exposed with a beam of prescribed stimulation. Element 302 indicates that an analysis is made to determine whether or not the next expose will occur within a time $T_1$. If exposure is to occur within time $T_1$, the process loops back to element 300 so that exposure may continue. If exposure is not to occur within time $T_1$, the beam power is inhibited from reaching a frequency conversion crystal as indicated by element 304. Element 306 indicates that an analysis is performed to determine whether or not a next exposure will occur in a time $T_2$. If exposure is not to occur within the time $T_2$, the process continues to loop through element 306. If it is determined that exposure should occur within a time $T_2$, power is reapplied to the frequency conversion crystal (element 308) so that prescribed stimulation production is reinitiated and exposure may again occur according to element 300.

An advantage to this technique is in extending the effective life of the laser system. In this context the term "effective life" refers to the number of hours of object formation that may be obtained from the laser between repairs. When a frequency converted laser is used in producing ultraviolet radiation, damage to the exiting surface of the frequency conversion crystal that is responsible for UV radiation production has been observed. This damage has been responsible for significantly shortening laser life. As the extent of damage to the UV radiation producing crystal appears to be directly related to the power produced by the crystal and the time of operation, the present embodiment lengthens the effective life of the laser by reducing the power exiting the crystal. A preferred laser for use in this embodiment is the laser illustrated in FIGS. 1c and 1d. As indicated, an AOM (i.e. acousto-optic modulator) 72 is located between IR laser head 70 and two frequency conversion crystals 74 and 76. The AOM is controlled by the system control computer (e.g. process computer) to inhibit the power from reaching the frequency conversion crystals when it is not needed for exposing the building material 5 at surface 20 or for some other purpose. As it is not uncommon for recoating time, and other periods of non-exposure to exceed over 50% of the actual time for forming an object, it is possible for this technique to double or even further extend laser life.

Figure 4:
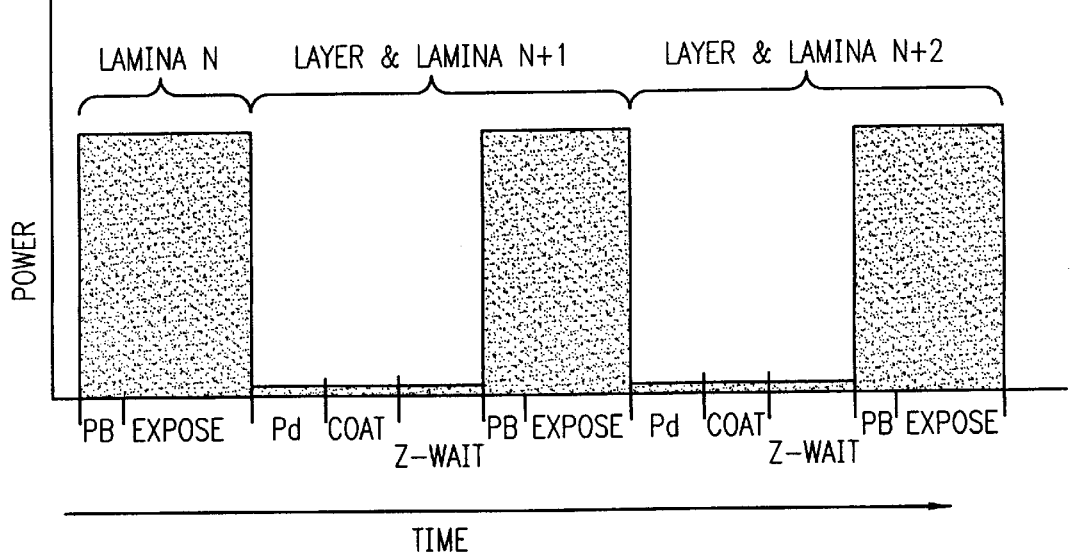
FIG. 4 depicts a plot of scanning speed for different vector types, IR and UV powers produced by the laser generator over several representative build stages as used in a preferred embodiment.

The result of this technique is illustrated in FIG. 4 where a plot of laser output power (output of prescribed stimulation is shown as a function of time). In this plot, the lapse of time covers the exposure of three layers and the formation of two layers. Several layer formation events are depicted in the Figure: (1) PB=Beam profiling and analysis, (2) Expose= Exposure of a layer to form a lamina, (3) Pd=Predip delay, (4) Coat=time to form a layer over a previously formed lamina which is typically the time to sweep a recoating device over the previously formed lamina, and (5) Z-wait= delay time after sweeping before exposure begins.

As indicated, during periods of exposure the prescribed stimulation is produced at desired levels for object production. Also as indicated, during non-exposure times the quantity of stimulation is drastically reduced. During non-exposure time extending more than a few seconds, it is preferred that prescribed stimulation production be reduced to under 50% of its exposure level, more preferably under 75%, even more preferably under 90%, and most preferably it is completely inhibited.

Besides the periods of inhibition noted in FIG. 4, other periods may exist when inhibition can occur. One such time is known as interhatch delay and is described in U.S. patent application Ser. No. 09/246,504 (filed concurrently herewith). Inhibition or reduction may occur during all of these periods, a portion of each period or even just a portion of one of these periods or during some other period.

Various ways may be used to reduce the laser power. The faster the ability to reduce the power and then to reestablish the power, the more effective the technique of this embodiment can be. As noted above, an acousto-optic modulator may be used to vary the power reaching the frequency conversion crystal(s). As the AOM can be used to completely inhibit production or to vary the power anywhere between 0% and 100% within a fraction of a second, it is a preferred device for this embodiment as well as for other embodiments to be discussed hereafter.

Other techniques for controlling laser power include: (1) a mechanism for variably supplying electric power to a laser diode source that supplies pumping energy to the laser source, (2) a mechanism for variably controlling operation of a Q-switch in the laser source, (3) an electro-optic modulator, (4) a mechanism for variably controlling a pulse repetition rate of the power in the beam, (5) a mechanism for controlling the temperature of a laser diode source that supplies pumping energy to the laser source, (6) a mechanism for controlling a temperature of a frequency conversion crystal through which the beam from the laser source passes, and (7) a computer controlled shutter.

The time period $T_1$ may be based on several factors. For example, these factors may include (1) time to attenuate or inhibit the beam, and (2) time to reactivate the beam and stabilize it. The time period $T_2$ may be based on several factors as well including (2) above and the period between recheck reevaluations. In an alternative, the decision to turn the beam on may be based on the lapse of a count down clock as opposed to looping through a comparison routine.

Second Preferred Embodiment

This embodiment provides a technique for effectively controlling vector exposure especially when high scan speeds are utilized. This technique links selected exposure vectors (i.e. vectors that are intended to expose building material) with one or more non-exposure vectors (i.e. vectors that are used to redirect the beam scanning direction and speed without significantly exposing the building material) so it is ensured that at the beginning of an exposure vector the scanning speed and direction of movement are appropriate for the vector to be traced. Likewise, at the end of an exposure vector it is ensured that the scanning speed remains appropriate for the vector.

A flowchart representing an implementation of this embodiment is provided as FIG. 5. FIG. 5 starts off with Element 400 which sets a variable "i" equal to one. This variable provides a designation for each exposure vector that is to be drawn. The next consecutive exposure vector is designated "i+1".

Element 402 calls for supplying data representing a first exposure vector, $EV_1$, and a second exposure vectors, $EV_{i+1}$. Some parameters for each vector include: (1) beginning X position for each vector, $Xi_b$, $X(i+1)_b$; (2) beginning Y position for each vector, $Yi_b$, $Y(i+1)_b$; (3) ending X position for each vector, $Xi_e$, $X(i+1)_e$; (4) ending Y position for each vector, $Yi_e$, $Y(i+1)_e$;(5) X component of scanning speed for each vector, $SX_i$ and $SX_{i+1}$; and (6) Y component of scanning speed for each vector, $SY_i$ and $SY_{i+1}$.

Element 404 calls for supplying values for four global control parameters: (1) HSBorder: Maximum per axis drawing speed for borders that do not require ramps=N1; (2) HSRamp: Speed change attainable when applying maximum acceleration=N2; (3) HSRest: Speed at which change of direction transitions are allowed to occur=N3; and (4) FF: time period for applying feed forward commands to the ends of some vectors=N4. Some preferred values for these parameters include HSBorder=70 ips (i.e. inches/second), HSRamp=25 ips/tick, HSRest=70 ips, and FF=4 ticks. In a preferred system 1 tick=15 microseconds.

Element 406 calls for determining the difference in speed along each of the X and Y axes between the first and second vectors. This information along with the global parameters 406 are taken as input to Element 408.

Element 408 calls for an analysis of whether or not either of ΔSX or ΔSY is greater than N1. If this condition is met, it means that a transition between the two vectors cannot occur without the introduction of two or more non-exposure vectors. If the response is "yes", the process proceeds to element 410 where the process of generating non-exposure vectors begin. Alternatively, if the response is "no", the process proceeds to element 424 where another enquiry is made.

Element 410 calls for applying feed forward acceleration control at the end of the "i"th exposure vector $EV_i$ for a period of N4, blocking the beam when the end of the "i"th exposure vector $EV_i$ is reached, and inserting a first ramp vector $RV1_i$ parallel to the "i"th exposure vector $EV_i$ at the end of $EV_i$. Feed forward is the concept of applying acceleration commands prior to the time that a change in direction or speed is to occur. The amount of acceleration force to apply and the time over which to apply it may be empirically determined based on optimizing the positioning and scanning speed at the end of the first vector and at the beginning of the second vector. It may be preferred to error on the side of rounding corners than overshooting them. This optimization may be based on minimizing the overall error in position and/or scanning speed that results when the transition is made. In a present preferred embodiment, scanning mirror commands are preferably updated every 15 microseconds. Each 15 microsecond period is considered one "tick". In a preferred system, the maximum acceleration has been set to approximately 25 inches/sec/tick. In this system, it has been empirically determined that use of a feed forward period of 4 ticks gives good results. Of course other values of N4 may be used in specifying the feed forward period depending on the system conditions and any desired positioning and speed tolerance criteria.

Element 412 calls for setting the time and/or length of the first ramp vector $RV1_i$ to a minimum amount necessary to allow both the X-scanner and the Y-scanner to reach a desired scanning speed when a desired maximum level of acceleration N2 is applied. The scanning time for the first ramp vector may be expressed mathematically as the greater of:

$(SX_i-N3-N4*N2)/N2$ or $(SY_i-N3-N4*N2)/N2.$

The length of the ramp vector may be determined from the derived timing and the acceleration value N2 being used.

Element 414 calls for creating a transition vector $TV_i$ starting at end of the first ramp vector $RV1_i$ and extending in the same direction as the first ramp vector for a length of time equal to a normal feed forward amount N4. In this embodiment the entire length of the vector receives feed forward acceleration commands. The feed forward commands accelerate each scanner appropriately to transition to a jump vector that will be created in element 420. As such, at this point in the process the feed forward criteria can not be specifically set.

Element 416 calls for inserting a second ramp vector $RV2_i$ parallel to the next exposure vector $EV_{i+1}$ so that the second ramp vector $RV2_1$ ends at the beginning of $EV_{i+1}$. The X and Y components of scanning speed at the end of the second ramp vector are equal to the desired values for the next exposure vector.

Element 418 calls for setting the time/length of the second ramp vector $RV2_i$. The time/length is set to an amount greater than or equal to the minimum necessary to transition from a scanning speed N3 of the jump vector to the scanning speed of the next exposure vector. The time period for scanning the second ramp vector may be specified to be the equal to or greater than the larger of $(SX_{i+1}-N3)/N2,$ or $(SY_{i+1}-N3)/N2.$ The length of the ramp vector may be determined from the derived timing and the acceleration value N2 being used.

Element 420 calls for inserting a jump vector $JV_i$ from the end of the first ramp vector $RV1_i$ to the beginning of the second ramp vector $RV2_i$. Feed forward acceleration commands are applied over the last N4 ticks of the jump vector $JV_i$. At the end of the jump vector (i.e. beginning of the next exposure vector), the propagation of the beam is uninhibited so that it is allowed to progress through the optical system to the building material.

Element 422 calls for controlling the scanning mirrors according to the exposure vectors and any generated non-exposure vectors.

Element 424 is reached by conclusion in element 408 that the change in both the X and Y scanning speed components is less than an acceptable amount set by the HSBorder variable. Element 424 calls for an analysis of whether the ending point of the "i"th exposure vector $EV_i$ is coincident with the beginning point of the (i+1)th exposure vector $EV_{i+1}$.

If the ending points are equivalent, then the process proceeds to Element 422. By failing the criterion of element 408 and passing the criterion of element 424, it may be concluded that a transition between the "i"th exposure vector and the (i+1)th exposure vector may be made with sufficient accuracy using only feed forward commands that will be applied at the end of the "i"th exposure vector.

If the criterion of element 424 is not met, the process proceeds to element 426 wherein a transition vector $JV_i$ is inserted between the "i"th and (i+1)th exposure vectors. This transition vector is used to bridge the gap between the two vectors. Additional non-exposure vectors are not typically needed as it is possible to achieve the desired changes in direction and speed based on use of feed forward acceleration commands at the end of the "i"th transition vector and the end of jump vector $JV_i$.

Element 428 inquiries as to whether $EV_i$ is the last vector to be formed. If it is not, variable "i" is incremented by one (element 432) and the process loops back through elements 402 to 428. If the "i"th exposure vector is the last vector, the process proceeds to element 430 where the beam is inhibited and the process ended.

Figure 6:
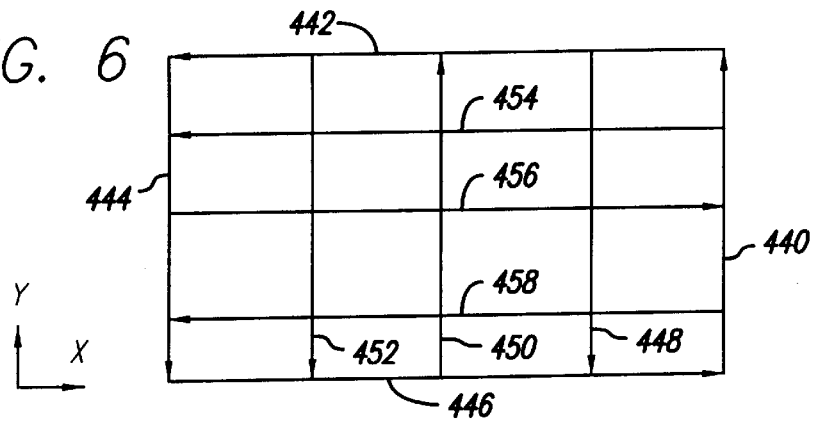
FIG. 6 depicts a group of hypothetical vectors that are to be used in exposing a layer of material.
Figure 7:
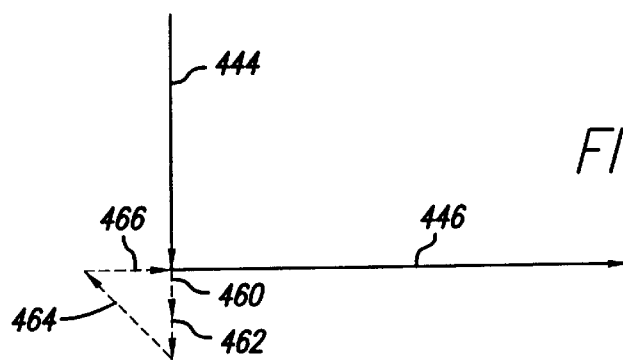
FIG. 7 depicts two of the vectors from FIG. 4 along with a number of non-exposure vectors that are used in a preferred embodiment to transition between the two exposure vectors.

Application of the procedure outlined in FIG. 5 is illustrated with the aid of FIGS. 6 and 7. FIG. 6 depicts a top view of a set of vectors for use in forming a hypothetical lamina. These vectors represent a cross-section of the object to be formed and are laid out in the X-Y plane. These vectors include a set of four boundary vectors 440, 442, 444, and 446. They also include a set of vectors 448, 450, and 452 internal to the boundary and parallel to the Y-axis (e.g. Y-hatch or Y-fill vectors). These cross-sectional vectors also include a set of vectors 454, 456, and 458 internal to the boundary and parallel to the X-axis (e.g. X-hatch or X-fill vectors). Each of these groupings of vectors may utilize different quantities of exposure, may have different position tolerance criteria, and be formed with different beam sizes; as such, the beam power used with each of these sets may be different.

The transition between two of the boundary vectors 444 and 446 is depicted in FIG. 7. Even though the two boundary vectors have a coincident point, the combination of their respective scanning speeds and angle result in a transition which cannot be made with sufficient accuracy without using a series of non-exposure vectors. As such, FIG. 7 depicts a first ramp vector 460 beginning at the end of exposure vector 444, extending in a direction parallel to that of vector 444, and having a length necessary to transition the scanning speed of 444 down to a desired amount (i.e. HSRest). A transition vector begins at the end of ramp vector 460, extending in a direction parallel to that of the ramp vector, and having a length equal to the desired Feed forward amount (e.g. 4 ticks). The transition vector is followed by a jump vector that extends to the beginning of a second ramp vector 466. Feed forward commands are supplied at the end of jump vector 464 to make the transition to the direction of the second ramp vector without necessarily changing the net scanning speed. The second ramp vector 466 connects the jump vector 464 to the next exposure vector 446. The length of the ramp vector is sufficient to allow the scanning speed to attain the desired value of the next exposure vector.

Figure 8:
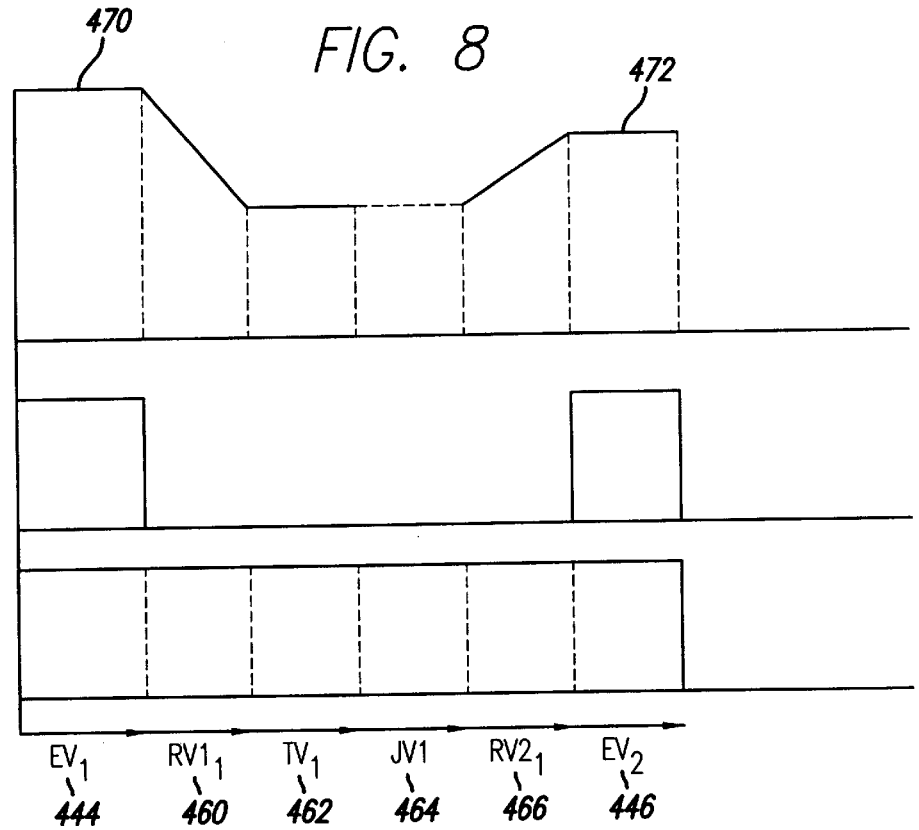
FIG. 8 depicts a plot of UV and IR power produced by the laser generator during tracing of the vectors shown in FIG. 8.
Figure 9:
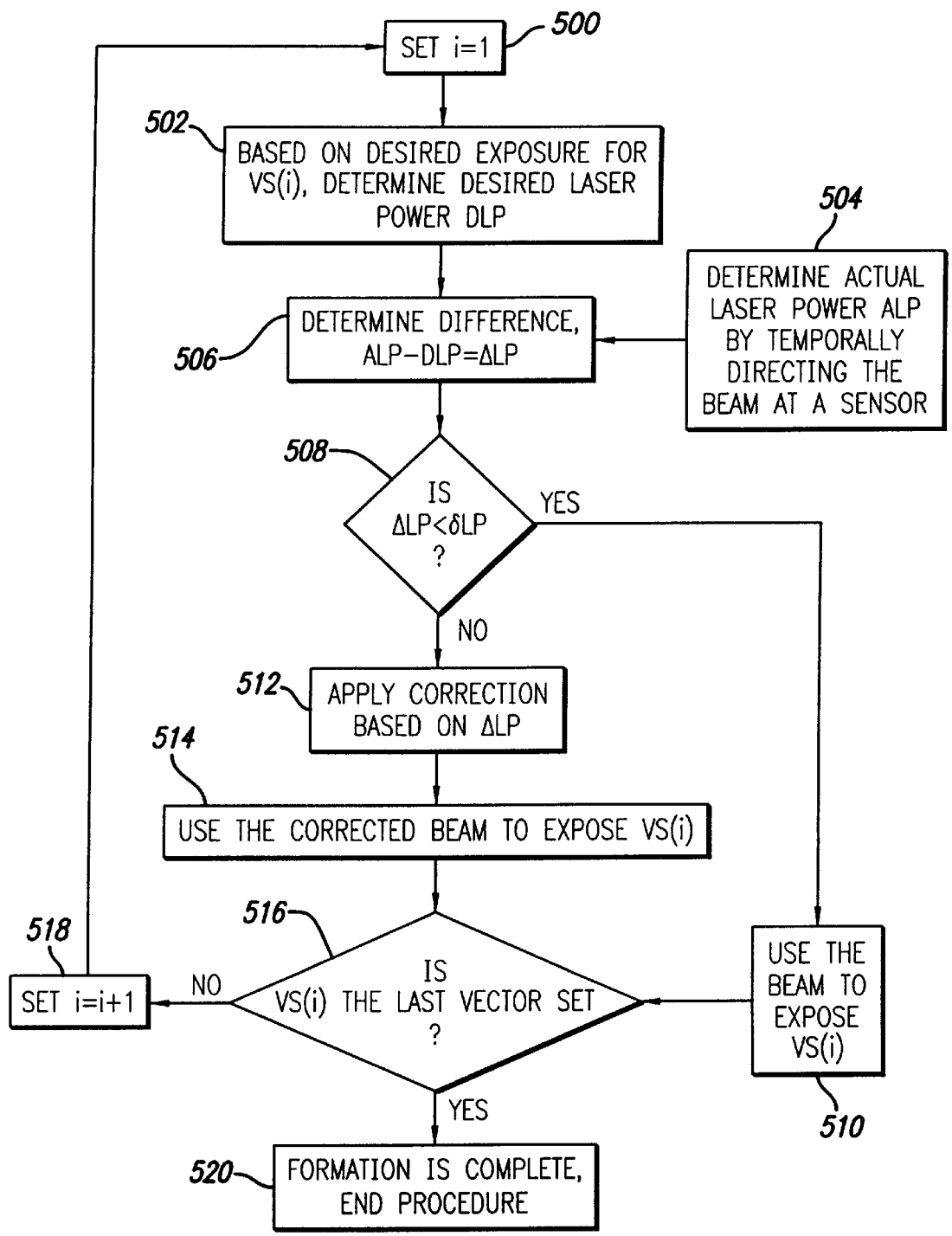
FIG. 9 depicts a flow chart of a preferred embodiment.

FIG. 8 depicts three plots of values for scanning variables (i.e. IR power production, UV power reaching the vat, and scanning speed) versus the two exposure vectors bridged by the non-exposure vectors of FIG. 7. As indicated in the lower portion of the figure, the IR power production of the laser preferably remains the same. As indicated in the middle portion of the figure, it is preferred that UV power reaches the vat only during scanning of the two exposure vectors 444 and 446. It is preferred that UV power production cease during the scanning of the non-exposure vectors. With an AOM acting as the beam inhibitor, it is possible to shut down the beam and revive it within a few microseconds. The upper portion of the figure provides a plot of the net scanning speed resulting from the speed of scanning of the two substantially orthogonal mirror scanners. As indicated, the exposure vector 444 is scanned with a large speed 470, the ramp vector 460 ramps the speed down to a desired lower amount, the transition vector 462 maintains the same net speed, the second ramp vector increases the scanning speed to a desired amount 472 for exposure vector 446.

Many alternatives to this embodiment exist and will be apparent to those of skill in the art. Examples of such alternatives include performing the coincidence check of element 424 prior to performing the speed difference check of Element 408. A jump vector may be initiated at the end of first exposure vector $EV_i$ without ramping the scanning speed. Different quantities of feed forward may be used ranging from 0 ticks up.

Different values for the global control parameters may be used. Different global control parameters may be used. The parameter values may be different for different elements of the process. For example, a different amount of feed forward may be applied to different vector types.

Third Preferred Embodiment

The third preferred embodiment provides a technique for adjusting the power of the prescribed stimulation. Element 500 calls for setting a process control variable "i" equal to one. Element 502 calls for determining a desired laser power DLP based on desired exposure for each of the vectors making up an "i"th vector set VS(i). The vector set may be made up of various vectors. For example, VS may include all vectors of a single type on a given cross-section. VS may include all vectors of all types on a single cross-section or on a plurality of cross-sections. The individual vectors in VS may be given different exposures but a common laser power is used in drawing with the vectors.

Element 504 calls for determining actual laser power (ALP) by temporally directing the beam at a sensor. It is preferred that this sensor be a full area detector or a point or slot detector from which the full beam power may be measured. It is preferred that this sensor be located along the optical path beyond the scanning mirrors so that the scanning mirrors may be used to direct the beam onto the sensor at desired times and then to direct the beam onto the surface of the building material.

Element 506 calls for determining the difference between the actual power and the desired power, $$ALP-DLP=\Delta LP$$

Element 508 calls for determining whether the difference in laser power is within a desired tolerance band $\delta LP$, $$\Delta LP < \delta LP$$

If a positive result is issued by the analysis of element 508, the process proceeds to Element 510 which calls for the use of the beam to expose VS (i) as no change in laser power is necessary. Element 512 calls for application of a correction factor to the power based on the difference in power $\Delta LP$. The process then proceeds to step 514 which calls for exposing VS(i) with the corrected beam.

The process then continues from either step 510 or 514, where an enquiry is made as to whether or not the VS(i) is the last vector set. If so, element 520 indicates that the process is complete. If not, the procedure moves to element 518 where "i" is incremented by one and the process loops back to element 500.

Various alternatives to this embodiment are possible. For example, element 512 may involve the correction of beam power based on a known setting to obtain a desired power instead of basing the correction on a difference in power. Element 512 may derive new parameter settings from a table correlating parameters setting with either a change in beam power or to absolute value of beam power. Element 512 may use an adjustment and feedback loop in combination with power sensing to set the laser power to a new desired level either alone or in combination with smart adjustments based on the power differences.

Adjustment of beam power preferably occurs by utilization of an inhibiting device (e.g. and AOM) located between a laser resonator and at least one frequency conversion element used in producing the prescribed stimulation.

Alternatively, beam power may be adjusted by an inhibiting device located along the optical path beyond the frequency conversion crystals or even within the laser resonator itself. Instead of using a sensor onto which the beam is temporarily presented, a sensor such as sensor 85 in FIG. 1*d* may be used in combination with a variety of power adjustment devices (e.g. those noted in conjunction with the first preferred embodiment), other than the AOM.

To optimize object formation it is preferred that the vector set be as small as possible. In particular, it is preferred that the vector set include less than all vectors in association with a particular cross-section. In other words, it is preferred that more than one vector set exist for each cross-section.

Vector sets may be based on the vector types noted previously for (e.g. boundary, transition, ramp, jump, Y-hatch, Y-fill, X-hatch, X-fill, exposure, non-exposure, etc.) each beam size that will use those vectors. It is preferred that the power adjustment be achieved in less than 1 second, more preferably less than 0.5 seconds, and most preferably in less than 0.1 seconds. The tolerance on laser power $\delta LP$ may be as small as a few mW or as large as 10% of the desired beam power depending on the exact criteria being considered.

The Fourth Embodiment

This embodiment provides a technique for changing laser power based on an estimation of whether or not the change will produce a desired minimum saving in exposure time. Instead basing changes in laser power strictly on whether or not the power level does not match a desired power level. The value of changing power is ascertained by comparing the difference in scanning time to a value based parameter. If the value of changing power is less than that required by the value based parameter, the beam power will remain unchanged.

As an example, drawing time for scanning VS(i) at first power may take a first period of time, while drawing time at a second higher power may take a second period of time. If the difference between the first and second times does not exceed the time to switch the power, or otherwise meet a specified value based parameter, then scanning will optimally be performed using the first beam power. An analogous procedure may be used for determining whether to switch between various beam sizes.

Figure 10:
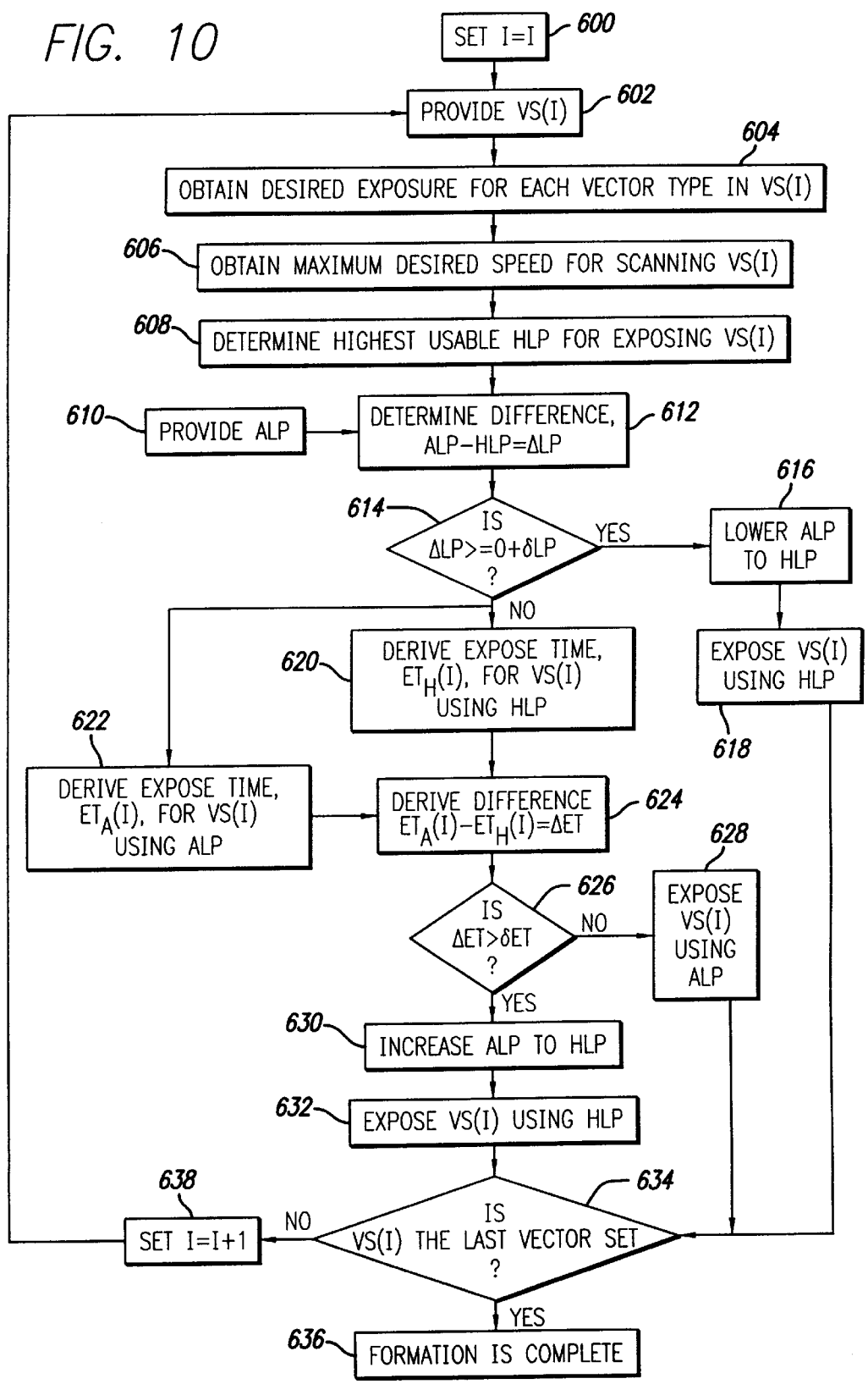
FIG. 10 depicts a flow chart of a preferred embodiment.

Element 600 of FIG. 10 calls for setting a process variable "i" equal to one. Element 602 calls for providing an "i"th vector set VS(i) where each vector in the set will be exposed with a beam having a single beam power.

Element 604 calls for obtaining a desired exposure for selected vector types, in the vector set VS(i). Element 606 calls for obtaining a maximum desired scanning speed for at least one type of vector in VS(i). Element 608 calls for determining the highest usable laser power HLP for use in exposing at least one vector type in VS(i). The selected vector type or types should be those for which an upper speed on scanning must not be exceeded.

Element 610 calls for providing an actual, or present, laser power ALP. Element 612 calls for determining a difference between the actual laser power and the highest useable power. This may be expressed as, $ALP-HLP=\Delta LP$ Element 614 inquires as to whether or not the difference in laser power is greater than zero plus a tolerance a laser power tolerance value. This may be expressed as $\Delta LP \geq 0 + \delta LP?$ If the response to the enquiry of element 614 is "yes", the process proceeds to Element 616 where the laser power is lowered from the ALP to HLP. Once the laser power is reset the process exposes the VS(I) using the HLP (Element 618)

If the response to the enquiry of element 614 was "no," the process moves forward to element 620 and 622. Element 620 calls for deriving the expose time, $ET_H(I)$, for the full set of vectors in VS(I) using the highest usable laser power HLP. Element 622 calls for deriving the expose time, $ET_A(I)$, for the full set of vectors in VS(I) using the actual laser power ALP.

Element 624 calls for determining the difference between the exposure time when using the actual laser power and the exposure time when using the highest possible laser power. This may be expressed as $ET_A(I)_o - ET_H(I) = \Delta ET$ Element 626 inquires as to whether or not the difference in exposure time is above a preset value. The preset value provides an indication of how much time must be saved in order to warrant a changing the laser power. This enquiry may be expressed as, Is $\Delta ET > \delta ET?$ If the enquiry produces a negative response, exposure occurs using the actual laser power (Element 628). If the enquiry produces a positive response, the laser power is increased to the highest useable power (Element 630). Whereafter Element 632 calls for exposing the vector set VS(i) using the highest usable laser power HLP.

Element 634 inquires as to whether the "i"th vector set VS(I) is the last vector set. If an affirmative response is obtained, the process proceeds to element 636 and determinates. If a negative response is obtained, the process proceeds to element 638 where the variable "i" is incremented by one, after which the process loops back to Element 602, where elements 602–634 are repeated until all the vector sets have been processed.

Various other alternatives and modifications to this fourth embodiment are possible. For example the derivation of exposure time may be based on an estimate or on an exact calculation. The preset value $\delta ET$ may be a constant or a variable. It may take on one value if the change in power is to cause a dead time in exposure or it may be zero if the change in power has no impact on build time because the change will occur during a non-drawing period anyway. Some alternatives have been discussed herein above while others will be apparent to those of skill in the art.

The Fifth Embodiment

A fifth embodiment of the invention provides another technique for setting beam power based on consideration of a number of parameters. This embodiment uses a beam consisting of a series of pulses with a pulse repetition rate and a beam diameter (the diameter being the cross-sectional dimension of the beam at the working surface of the building material).

In this embodiment a system user specifies a maximum draw speed by means of a graphical user interface. The maximum draw speed is specified for selected vectors. The selected vectors are those whose scan speeds are considered critical to the build process. Alternatively, the vectors for which maximum scan speed are specified may be those whose exposures are known to control the process based on their cure depths and the like, such that once they are specified, the specification of maximum speed for the other vector types would not change the process. Based on, inter alia, known material properties, desired cure depths, and maybe beam profile information, the beam power required to produce the maximum velocity is calculated for each of the vector types. For example, the vector type for which maximum scan speeds are specified may be one type of boundary and one type of hatch, alternatively boundary only or hatch only.

A top scanning speed is derived for each vector type. The top speed is based on the laser beam diameter, pulse repetition rate, and an overlap criteria specified for each vector type. The overlap criterion specifies how close two consecutive pulses must be so that sufficient overlap is obtained. This overlap is usually considered in terms of percentage of beam diameter. A sample equation for top speed is, $$\text{Top Speed} = Q*B*(1-OL)$$

Where Q is the pulse repetition rate in Hz, B is the beam diameter at the working surface in inches or mm, and OL is the minimum overlap criteria. The result of the computation is scanning speed in inches/second or mm/second. Overlap criteria may be empirically determined by building test objects with different overlap amounts and determining which overlap amounts produce objects with sufficient integrity, or other build property or build properties. Minimum overlap amounts on the order of 40%–60% of beam diameter have been found to be effective.

If a multiple beam diameter system and process is used, the small spot laser power is set to the lowest of:

(1) power for maximum scanning speed for the boundary as derived from the amount entered into the graphical user interface;

(2) power as derived from a top speed calculation based on the small spot beam size, boundary overlap criteria, and desired cure depths, etc.;

(3) a power for a scanning speed hard limit coded into a database for use with a small spot boundary based on desired cure depths, etc.;

(4) power for maximum scanning speed for the hatch as derived from the amount entered into the graphical user interface;

(5) power as derived from a top speed calculation based on the small spot beam size, hatch overlap criteria, desired cure depths, etc.;

(6) a power for a hard limit coded into a database for use with a small spot hatch based on desired cure depth etc.;

If a single sized beam is used instead of two or more beams the limit derived by the above process would be used to set the laser power. A similar set of comparisons as noted above would be used in setting the large spot laser power.

The above process may be carried out based on the comparison noted above or on other comparisons providing the same or a similar result. For example, the speeds of (1), (2) and (3) may be compared and the lowest of those speeds used in determining the maximum usable laser power for small spot boundary. Similarly, the speeds for (4), (5), and (6) may be compared and the lower value used in determining the maximum usable laser power for small spot hatch. The maximum laser powers for small spot hatch and boundary may then be compared and the lower value selected as the maximum usable spot for use with small spot and the vectors in the set of vectors considered. The process may be repeated for determination of large spot power settings.

Many alternatives to this procedure exist. For example, the vector types considered in the comparison above need only be those which are included in the vector set being considered. Maximum laser power may be determined for different types of boundaries, hatch, and even fill. Maximum laser power need not be based on a user-identified maximum scanning speed in some circumstances. Maximum laser power need not be based on an existing hard coded limit. The process is still applicable for a single vector type included in the vector set.

Various further alternatives and modifications to this embodiment are possible. Some of these alternatives have been discussed herein above while others will be apparent to those of skill in the art.

Further Alternatives

Implementation of the methods described herein to form apparatus for forming objects according to the teachings herein can be implemented by programming an SLA control computer, or separate data processing computer, through software or hard coding. Methods and apparatus in any embodiment can be modified according to the alternative teachings explicitly described in association with one or more of the other embodiments. Furthermore, the methods and apparatus in these embodiments and their alternatives can be modified according to various teachings in the above incorporated patents and applications. It is believed that the teachings herein can be applied to other RP&M technologies.

Though particular embodiments have been described and illustrated and many alternatives proposed, many additional embodiments and alternatives will be apparent to those of skill in the art upon review of the teachings herein. As such, these embodiments are not intended to limit the scope of the invention, but instead to be exemplary in nature.

We claim:

1. A stereolithographic method of forming a three-dimensional object from a plurality of adhered laminae by exposing successive layers of a material to a beam of prescribed stimulation, comprising;

(a) providing a pulsed beam of prescribed stimulation, having a pulse repetition rate, a desired beam diameter, and a desired beam power for use in exposing each vector in a given set of vectors;

(b) providing a plurality of vector types in the set of vectors for exposing layers of material;

(c) providing a desired maximum scan speed for at least one vector type in the set;

(d) deriving a top scan speed based on the pulse repetition rate and beam diameter;

(e) resetting, to the top scan speed, any desired maximum scan speed provided in (c) that exceeds the top scan speed;

(f) using each maximum scan speed as reset in (e) or as remaining from that provided in (c) to derive a maximum laser power;

(g) setting the desired beam power to an amount equal to or less than the smallest maximum laser power derived in (f);

(h) forming a layer of material adjacent to any last formed layer of material in preparation for forming a subsequent lamina of the object;

(i) exposing the layer to the beam of prescribed stimulation having the desired beam power under the control of the set of vectors; and (j) repeating the acts of forming and exposing a plurality of times in order to form the object from a plurality of adhered laminae.

2. A stereolithographic apparatus for forming a three-dimensional object from a plurality of adhered laminae by exposing successive layers of a material to a beam of prescribed stimulation, comprising:

(a) means for providing a pulsed beam of prescribed stimulation, having a pulse repetition rate, a desired beam diameter, and a desired beam power for use in exposing each vector in a given set of vectors;

(b) means for providing a plurality of vector types in the set of vectors for exposing layers of material;

(c) means for providing a desired maximum scan speed for at least one vector type in the set;

(d) means for deriving a top scan speed based on the pulse repetition rate and beam diameter;

(e) means for resetting, to the top scan speed, any desired maximum scan speed provided in (c) that exceeds the top scan speed;
(f) means for using each maximum scan speed as reset in (e) or as remaining from that provided (c) to derive a maximum laser power;
(g) means for setting the desired beam power to an amount equal to or less than the smallest maximum laser power derived in (f);
(h) means for forming a layer of material adjacent to any last formed layer of material in preparation for forming a subsequent lamina of the object;
(i) means for exposing the layer to the beam of prescribed stimulation having the desired beam power under the control of the set of vectors; and
(j) means for operating the means for forming and means for exposing a plurality of times in order to form the object from a plurality of adhered laminae.

3. A stereolithographic apparatus for forming a three-dimensional object from a plurality of adhered laminae by exposing successive layers of a material to a beam of prescribed stimulation, comprising:
(a) a source of a pulsed beam of prescribed stimulation, having a pulse repetition rate, a desired beam diameter, and a desired beam power for use in exposing each vector in a given set of vectors;
(b) a computer programmed to provide a plurality of vector types in the set of vectors for exposing layers of material;
(c) a memory for holding a desired maximum scan speed for at least one vector type in the set;
(d) a computer programmed to:
(1) derive a top scan speed based on the pulse repetition rate and beam diameter;
(2) reset, to the top scan speed, any desired maximum scan speed provided in (c) that exceeds the top speed;
(3) use each maximum scan speed as reset in (d)(2) or as remaining from (c) to derive a maximum laser power;
(4) set the desired beam power to an amount equal to or less than the smallest maximum laser power derived in (d)(3);
(e) a recoating system for forming a layer of material adjacent to any last formed layer of material in preparation for forming a subsequent lamina of the object;
(f) an exposure system for exposing the layer, to the beam of prescribed stimulation having the desired beam power, under the control of the set of vectors; and
(g) a computer programmed to operate the recoating system and the exposure system to form the object from a plurality of adhered laminae.

4. The method according to claim 1 further comprising providing the vector types in the set of vectors from the group consisting of boundary, transition, ramp, jump, Y-hatch, Y-fill, X-hatch, X-fill, exposure, and non-exposure vector types.

5. The apparatus according to claim 2 further comprising the means for providing the vector types in the set of vectors providing vector types from the group consisting of boundary, transition, rarnp, jump, Y-hatch, Y-fill, X-hatch, X-fill, exposure, and non-exposure vector types.

6. The apparatus according to claim 3 further comprising the computer providing the vector types in the set of vectors providing vector types from the group consisting of boundary, transition, ramp, jump, Y-hatch, Y-fill, X-hatch, X-fill, exposure, and non-exposure vector types.

7. A stereolithographic method of forming a three-dimensional object from a plurality of adhered laminae by exposing successive layers of a material to a beam of prescribed stimulation, comprising:
(a) providing a pulsed beam of prescribed stimulation, having a pulse repetition rate, a desired beam diameter, and a desired beam power for use in exposing each vector in a given set of vectors;
(b) providing at least one vector type in the set of vectors for exposing layers of material;
(c) providing a desired maximum scan speed for at the least one vector type in the set;
(d) deriving a top scan speed based on the pulse repetition rate and beam diameter,
(e) resetting, to the top scan speed, any desired maximum scan speed provided in (c) that exceeds the top scan speed;
(f) using each maximum scan speed as reset in (e) or as remaining from that provided in (c) to derive a maximum laser power;
(g) setting the desired beam power to an amount equal to or less than the smallest maximum laser power derived in (f);
(h) forming a layer of material adjacent to any last formed layer of material in preparation for forming a subsequent lamina of the object;
(i) exposing the layer to the beam of prescribed stimulation having the desired beam power under the control of the set of vectors; and
(j) repeating the acts of forming and exposing a plurality of times in order to form the object from a plurality of adhered laminae.

8. A stereolithographic apparatus for forming a three-dimensional object from a plurality of adhered laminae by exposing successive layers of a material to a beam of prescribed stimulation, comprising:
(a) a source of a pulsed beam of prescribed stimulation, having a pulse repetition rate, a desired beam diameter, and a desired beam power for use in exposing each vector in a given set of vectors;
(b) a computer programmed to provide at least one vector type in the set of vectors for exposing layers of material;
(c) a memory for holding a desired maximum scan speed for at least one vector type in the set;
(d) a computer programmed to:
(1) derive a top scan speed based on the pulse repetition rate and beam diameter;
(2) reset, to the top scan speed, any desired maximum scan speed provided in (c) that exceeds the top speed;
(3) use each maximum scan speed as reset in (d)(2) or as remaining from (c) to derive a maximum laser power;
(4) set the desired beam power to an amount equal to or less than the smallest maximum laser power derived in (d)(3);
(e) a recoating system for forming a layer of material adjacent to any last formed layer of material in preparation for forming a subsequent lamina of the object;
(f) an exposure system for exposing the layer, to the beam of prescribed stimulation having the desired beam power, under the control of the set of vectors; and
(g) a computer programmed to operate the recoating system and the exposure system to form the object from a plurality of adhered laminae.

* * * * *